# United States Patent

Fujii et al.

(10) Patent No.: US 12,216,409 B2
(45) Date of Patent: Feb. 4, 2025

(54) EXPOSURE SYSTEM, LASER CONTROL PARAMETER PRODUCTION METHOD, AND ELECTRONIC DEVICE MANUFACTURING METHOD

(71) Applicant: Gigaphoton Inc., Tochigi (JP)

(72) Inventors: Koichi Fujii, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 233 days.

(21) Appl. No.: 17/817,182

(22) Filed: Aug. 3, 2022

(65) Prior Publication Data

US 2022/0373893 A1 Nov. 24, 2022

Related U.S. Application Data

(63) Continuation of application No. PCT/JP2020/012413, filed on Mar. 19, 2020.

(51) Int. Cl.
*G03F 7/00* (2006.01)
*H01S 3/08* (2023.01)
(Continued)

(52) U.S. Cl.
CPC ...... *G03F 7/70041* (2013.01); *G03F 7/70058* (2013.01); *H01S 3/094076* (2013.01);
(Continued)

(58) Field of Classification Search
CPC .... G03F 7/70041; G03F 7/70058; G03F 7/20; G03F 7/70125; G03F 7/70441;
(Continued)

(56) References Cited

U.S. PATENT DOCUMENTS 7,154,928 B2 * 12/2006 Sandstrom .......... G03F 7/70575
372/55
9,715,180 B2 * 7/2017 Lalovic ............... G03F 7/70041
(Continued)

FOREIGN PATENT DOCUMENTS

JP 2006-179937 A 7/2006
JP 2007-081393 A 3/2007
(Continued)

OTHER PUBLICATIONS

International Search Report issued in PCT/JP2020/012413; mailed Jun. 16, 2020.
(Continued)

*Primary Examiner* — Deoram Persaud
(74) *Attorney, Agent, or Firm* — Studebaker & Brackett PC

(57) ABSTRACT

An exposure system according to an aspect of the present disclosure includes a laser apparatus emitting a pulse laser beam, an illumination optical system guiding the pulse laser beam to a reticle, a reticle stage moving the reticle, and a processor controlling emission of the pulse laser beam and movement of the reticle. The exposure system performs scanning exposure of a semiconductor substrate by irradiating the reticle with the pulse laser beam. The reticle has first and second regions. The processor instructs the laser apparatus about, based on proximity effect characteristics corresponding to the first and second regions, a value of a control parameter of the pulse laser beam corresponding to each region so that the laser apparatus emits the pulse laser beam with which a difference of the proximity effect characteristic of each region from a reference proximity effect characteristic is in an allowable range.

23 Claims, 28 Drawing Sheets

(51) Int. Cl.
  *H01S 3/094* (2006.01)
  *H01S 3/0941* (2006.01)
  *H01S 3/13* (2006.01)
  *H01S 3/16* (2006.01)
  *H01S 3/225* (2006.01)

(52) U.S. Cl.
  CPC .......... *H01S 3/0941* (2013.01); *H01S 3/1305* (2013.01); *H01S 3/1625* (2013.01); *H01S 3/1636* (2013.01); *H01S 3/2251* (2013.01); *H01S 3/08059* (2013.01)

(58) Field of Classification Search
  CPC .. G03F 7/705; G03F 7/70558; G03F 7/70575; G03F 7/70716; G03F 7/70783; G03F 7/70875; G03F 7/70991; G03F 9/7003; G03F 9/7046; H01S 3/08059; H01S 3/094076; H01S 3/0941; H01S 3/1305; H01S 3/1625; H01S 3/1636; H01S 3/2251; H01S 3/1301; H01S 3/1306; H01S 3/131; H01S 3/134; H01S 3/137; H01S 3/2366; H01S 3/2375; G01B 11/00; G01B 11/14; H01L 21/68
  See application file for complete search history.

(56) References Cited

U.S. PATENT DOCUMENTS

| | | | |
|---|---|---|---|
| 11,977,339 B2* | 5/2024 | Shibazaki | G03F 7/70991 |
| 2003/0227607 A1 | 12/2003 | Kato et al. | |
| 2004/0012844 A1 | 1/2004 | Ohtsuki et al. | |
| 2006/0035160 A1 | 2/2006 | Troost et al. | |
| 2006/0139607 A1 | 6/2006 | Bruls et al. | |
| 2006/0139610 A1 | 6/2006 | Bruls et al. | |
| 2006/0170899 A1 | 8/2006 | De Kruif et al. | |
| 2006/0192935 A1* | 8/2006 | Hansen | G03F 7/70191 355/69 |
| 2007/0046921 A1* | 3/2007 | Takahashi | G03F 7/70091 355/71 |
| 2007/0059614 A1 | 3/2007 | Finders et al. | |
| 2007/0273852 A1 | 11/2007 | Arai | |
| 2010/0329290 A1 | 12/2010 | De Kruif et al. | |
| 2011/0205512 A1 | 8/2011 | Seong et al. | |
| 2012/0057144 A1 | 3/2012 | De Kruif et al. | |
| 2015/0070673 A1 | 3/2015 | Lalovic et al. | |
| 2015/0168848 A1* | 6/2015 | Tanaka | G03F 7/70483 438/16 |
| 2018/0196347 A1 | 7/2018 | Minegishi et al. | |
| 2019/0245321 A1 | 8/2019 | Kakizaki et al. | |
| 2022/0371121 A1* | 11/2022 | Fujii | B23K 26/082 |
| 2022/0373896 A1* | 11/2022 | Fujii | G03F 7/70041 |
| 2023/0098685 A1* | 3/2023 | Fujii | H01S 3/225 372/25 |
| 2023/0187286 A1* | 6/2023 | Oga | G03F 7/20 438/14 |

FOREIGN PATENT DOCUMENTS

| | | |
|---|---|---|
| JP | 2007-142052 A | 6/2007 |
| WO | 2007/004567 A1 | 1/2007 |
| WO | 2018/105082 A1 | 6/2018 |

OTHER PUBLICATIONS

International Preliminary Report on Patentability (Chapter I) and Written Opinion of the International Searching Authority issued in PCT/JP2020/012413; issued Sep. 20, 2022.

* cited by examiner

Fig. 15

| CHARACTERISTIC VALUE OF WAFER FORMATION PATTERN | OPE CHARACTERISTIC | OPE(1) (Area(1)OPE) | OPE(2) (Area(2)OPE) | OPE(3) (Area(3)OPE) | ... | OPE(k) (Area(k)OPE) | ... | OPE(n) (Area(n)OPE) |
|---|---|---|---|---|---|---|---|---|
| EXPOSURE AMOUNT | EXPOSURE AMOUNT D | D(1) | D(2) | D(3) | ... | D(k) | ... | D(n) |
| LASER-BEAM CONTROL PARAMETERS | WAVELENGTH λ | λ(1) | λ(2) | λ(3) | ... | λ(k) | ... | λ(n) |
| | SPECTRUM LINE WIDTH Δλ | Δλ(1) | Δλ(2) | Δλ(3) | ... | Δλ(k) | ... | Δλ(n) |
| | PULSE ENERGY E | E(1) | E(2) | E(3) | ... | E(k) | ... | E(n) |

Fig. 24
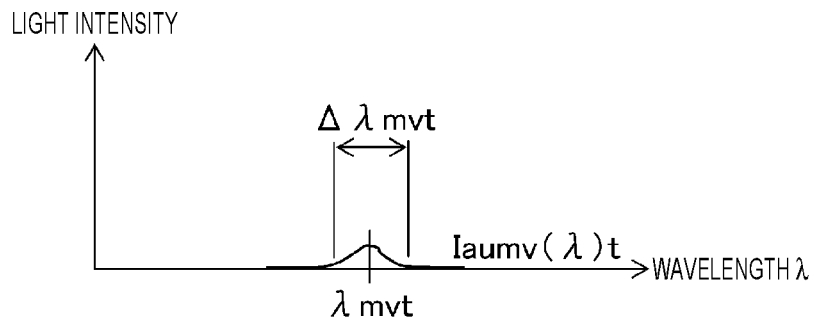
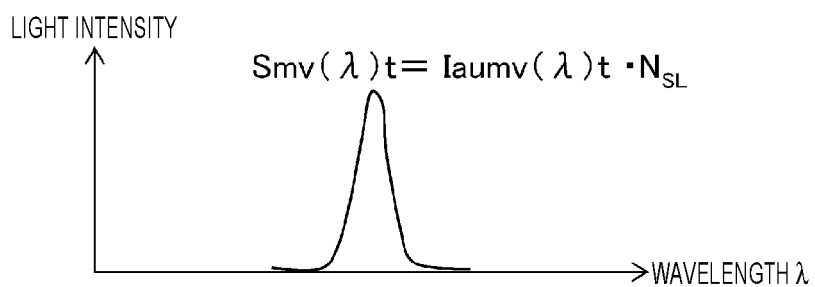
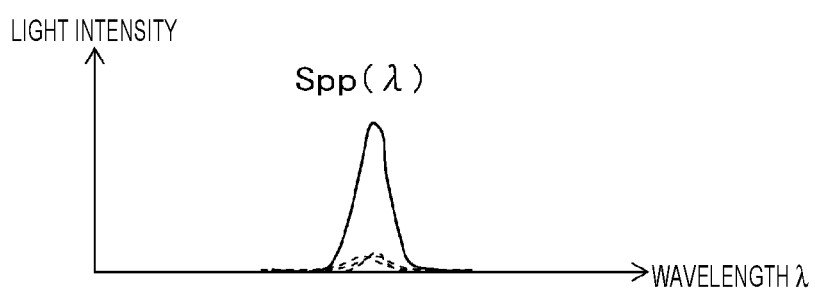
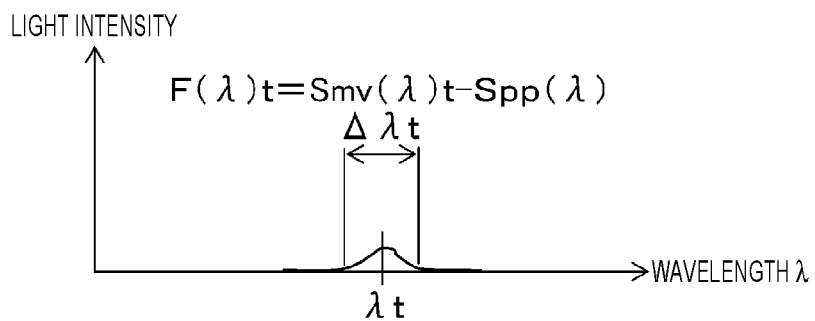

Fig. 25

| PULSE NO. | TIME POINT TIME | PULSE ENERGY E | INTEGRATED VALUE Dmv OF MOVING-INTEGRATION PULSE ENERGY | WAVELENGTH $\lambda$ | WAVELENGTH $\lambda mv$ OF MOVING-INTEGRATION SPECTRUM WAVEFORM | SPECTRUM LINE WIDTH $\Delta\lambda$ | SPECTRUM LINE WIDTH $\Delta\lambda mv$ OF MOVING-INTEGRATION SPECTRUM WAVEFORM | SPECTRUM WAVEFORM DATA F($\lambda$) | | | | | |
|---|---|---|---|---|---|---|---|---|---|---|---|---|---|
| | | | | | | | | INTENSITY OF $\lambda 1$ | INTENSITY OF $\lambda 2$ | ... | INTENSITY OF $\lambda k$ | ... | INTENSITY OF $\lambda n$ |
| 1 | TIME(1) | E(1) | — | $\lambda(1)$ | — | $\Delta\lambda(1)$ | — | $I\lambda 1(1)$ | $I\lambda 2(1)$ | ... | $I\lambda k(1)$ | ... | $I\lambda n(1)$ |
| 2 | TIME(2) | E(2) | — | $\lambda(2)$ | — | $\Delta\lambda(2)$ | — | $I\lambda 1(2)$ | $I\lambda 2(2)$ | ... | $I\lambda k(2)$ | ... | $I\lambda n(2)$ |
| 3 | TIME(3) | E(3) | — | $\lambda(3)$ | — | $\Delta\lambda(3)$ | — | $I\lambda 1(3)$ | $I\lambda 2(3)$ | ... | $I\lambda k(3)$ | ... | $I\lambda n(3)$ |
| 4 | TIME(4) | E(4) | — | $\lambda(4)$ | — | $\Delta\lambda(4)$ | — | $I\lambda 1(4)$ | $I\lambda 2(4)$ | ... | $I\lambda k(4)$ | ... | $I\lambda n(4)$ |
| 5 | TIME(5) | E(5) | — | $\lambda(5)$ | — | $\Delta\lambda(5)$ | — | $I\lambda 1(5)$ | $I\lambda 2(5)$ | ... | $I\lambda k(5)$ | ... | $I\lambda n(5)$ |
| . | . | . | . | . | . | . | . | . | . | . | . | . | . |
| $N_{SL}$ | TIME($N_{SL}$) | E($N_{SL}$) | Dmv(1) | $\lambda(N_{SL})$ | $\lambda mv(1)$ | $\Delta\lambda(N_{SL})$ | $\Delta\lambda mv(1)$ | $I\lambda 1(N_{SL})$ | $I\lambda 2(N_{SL})$ | ... | $I\lambda k(N_{SL})$ | ... | $I\lambda n(N_{SL})$ |
| $N_{SL}+1$ | TIME($N_{SL}+1$) | E($N_{SL}+1$) | Dmv(2) | $\lambda(N_{SL}+1)$ | $\lambda mv(2)$ | $\Delta\lambda(N_{SL}+1)$ | $\Delta\lambda mv(2)$ | $I\lambda 1(N_{SL}+1)$ | $I\lambda 2(N_{SL}+1)$ | ... | $I\lambda k(N_{SL}+1)$ | ... | $I\lambda n(N_{SL}+1)$ |
| $N_{SL}+2$ | TIME($N_{SL}+2$) | E($N_{SL}+2$) | Dmv(3) | $\lambda(N_{SL}+2)$ | $\lambda mv(3)$ | $\Delta\lambda(N_{SL}+2)$ | $\Delta\lambda mv(3)$ | $I\lambda 1(N_{SL}+2)$ | $I\lambda 2(N_{SL}+2)$ | ... | $I\lambda k(N_{SL}+2)$ | ... | $I\lambda n(N_{SL}+2)$ |
| $N_{SL}+3$ | TIME($N_{SL}+3$) | E($N_{SL}+3$) | Dmv(4) | $\lambda(N_{SL}+3)$ | $\lambda mv(4)$ | $\Delta\lambda(N_{SL}+3)$ | $\Delta\lambda mv(4)$ | $I\lambda 1(N_{SL}+3)$ | $I\lambda 2(N_{SL}+3)$ | ... | $I\lambda k(N_{SL}+3)$ | ... | $I\lambda n(N_{SL}+3)$ |
| $N_{SL}+4$ | TIME($N_{SL}+4$) | E($N_{SL}+4$) | Dmv(5) | $\lambda(N_{SL}+4)$ | $\lambda mv(5)$ | $\Delta\lambda(N_{SL}+4)$ | $\Delta\lambda mv(5)$ | $I\lambda 1(N_{SL}+4)$ | $I\lambda 2(N_{SL}+4)$ | ... | $I\lambda k(N_{SL}+4)$ | ... | $I\lambda n(N_{SL}+4)$ |
| $N_{SL}+5$ | TIME($N_{SL}+5$) | E($N_{SL}+5$) | Dmv(6) | $\lambda(N_{SL}+5)$ | $\lambda mv(6)$ | $\Delta\lambda(N_{SL}+5)$ | $\Delta\lambda mv(6)$ | $I\lambda 1(N_{SL}+5)$ | $I\lambda 2(N_{SL}+5)$ | ... | $I\lambda k(N_{SL}+5)$ | ... | $I\lambda n(N_{SL}+5)$ |
| . | . | . | . | . | . | . | . | . | . | . | . | . | . |
| z | TIME(z) | E(z) | Dmv(z−$N_{SL}$+1) | $\lambda(z)$ | $\lambda mv(z-N_{SL}+1)$ | $\Delta\lambda(z-N_{SL}+1)$ | $\Delta\lambda mv(z)$ | $I\lambda 1(z-N_{SL}+1)$ | $I\lambda 2(z-N_{SL}+1)$ | ... | $I\lambda k(z-N_{SL}+1)$ | ... | $I\lambda n(z-N_{SL}+1)$ |

EXPOSURE SYSTEM, LASER CONTROL PARAMETER PRODUCTION METHOD, AND ELECTRONIC DEVICE MANUFACTURING METHOD

CROSS-REFERENCE TO RELATED APPLICATIONS

The present application is a continuation application of International Application No. PCT/JP2020/012413 filed on Mar. 19, 2020, the entire contents of which are hereby incorporated by reference.

BACKGROUND

1. Technical Field

The present disclosure relates to an exposure system, a laser control parameter production method, and an electronic device manufacturing method.

2. Related Art

Recently, in a semiconductor exposure apparatus, resolving power improvement has been requested along with miniaturization and high integration of a semiconductor integrated circuit. Thus, the wavelength of light discharged from an exposure light source has been shortened. Examples of a gas laser apparatus for exposure include a KrF excimer laser apparatus configured to emit a laser beam having a wavelength of 248 nm approximately and an ArF excimer laser apparatus configured to emit a laser beam having a wavelength of 193 nm approximately.

The KrF excimer laser apparatus and the ArF excimer laser apparatus have a wide spectrum line width of 350 to 400 pm for spontaneous oscillation light. Thus, chromatic aberration occurs in some cases when a projection lens is made of a material that transmits ultraviolet light such as a KrF or ArF laser beam. As a result, resolving power potentially decreases. Thus, the spectrum line width of a laser beam emitted from such a gas laser apparatus needs to be narrowed until chromatic aberration becomes negligible. To narrow the spectrum line width, a line narrowing module (LNM) including a line narrow element (for example, etalon or grating) is provided in a laser resonator of the gas laser apparatus in some cases. In the following description, a gas laser apparatus that achieves narrowing of the spectrum line width is referred to as a line narrow gas laser apparatus.

LIST OF DOCUMENTS

Patent Documents

Patent Document 1: US Patent Application Publication No. 2015/0070673
Patent Document 2: US Patent Application Publication No. 2011/0205512
Patent Document 3: US Patent Application Publication No. 2006/0035160
Patent Document 4: US Patent Application Publication No. 2003/0227607
Patent Document 5: US Patent Application Publication No. 2018/0196347
Patent Document 6: US Patent Application Publication No. 2019/0245321
Patent Document 7: US Patent Application Publication No. 2004/0012844

SUMMARY

An exposure system according to an aspect of the present disclosure is an exposure system that performs scanning exposure of a semiconductor substrate by irradiating a reticle with a pulse laser beam. The exposure system includes a laser apparatus configured to emit a pulse laser beam, an illumination optical system through which the pulse laser beam is guided to a reticle, a reticle stage configured to move the reticle, and a processor configured to control emission of the pulse laser beam from the laser apparatus and movement of the reticle by the reticle stage. The reticle has a first region and a second region. The processor instructs the laser apparatus about, based on a proximity effect characteristic corresponding to each of the first region and the second region, a value of a control parameter of the pulse laser beam corresponding to each of the regions so that the laser apparatus emits the pulse laser beam with which a difference of the proximity effect characteristic of each of the regions from a reference proximity effect characteristic is in an allowable range.

A laser control parameter production method according to another aspect of the present disclosure is a method of producing a laser control parameter, the method being executed by a processor. The laser control parameter is a control parameter of a pulse laser beam with which a reticle of an exposure system configured to perform scanning exposure of a semiconductor substrate is irradiated. The method includes calculating, by the processor, a proximity effect characteristic corresponding to each of the first region and the second region, of the reticle; determining, by the processor, based on a result of the calculation, a value of the control parameter of the pulse laser beam with which a difference of the proximity effect characteristic of each of the regions from a reference proximity effect characteristic is in an allowable range; and storing, by the processor, the determined value of the control parameter in a file in association with a corresponding one of the regions.

An electronic device manufacturing method according to another aspect of the present disclosure is an electronic device manufacturing method comprising performing scanning exposure of a photosensitive substrate by irradiating a reticle with a pulse laser beam by using an exposure system to manufacture an electronic device. The exposure system includes a laser apparatus configured to emit the pulse laser beam, an illumination optical system through which the pulse laser beam is guided to the reticle, a reticle stage configured to move the reticle, and a processor configured to control emission of the pulse laser beam from the laser apparatus and movement of the reticle by the reticle stage. The reticle has a first region and a second region. The processor instructs the laser apparatus about, based on a proximity effect characteristic corresponding to each of the first region and the second region, a value of a control parameter of the pulse laser beam corresponding to each of the regions so that the laser apparatus emits the pulse laser beam with which a difference of the proximity effect characteristic of each of the regions from a reference proximity effect characteristic is in an allowable range.

BRIEF DESCRIPTION OF THE DRAWINGS

Embodiments of the present disclosure will be described below merely as examples with reference to the accompanying drawings.

FIG. 15 is a table listing exemplary data written to a file A.

FIG. 24 illustrates exemplary spectrum waveforms obtained at calculation steps illustrated in FIG. 23.

FIG. 25 is a table listing exemplary data written to a file B.

DESCRIPTION OF EMBODIMENTS

<Contents>
1. Terms
2. Overview of exposure system according to comparative example
  2.1 Configuration
  2.2 Operation
  2.3 Exemplary exposure operation on wafer
  2.4 Relation between scanning field and static exposure area
  2.5 Typical process of OPE correction
  2.6 Problem
3. Embodiment 1
  3.1 Overview of lithography system
    3.1.1 Configuration
    3.1.2 Operation
  3.2 Exemplary laser apparatus
    3.2.1 Configuration
    3.2.2 Operation
    3.2.3 Other
  3.4 Exemplary contents of processing by lithography control unit
  3.5 Exemplary contents of processing by exposure control unit
  3.6 Exemplary contents of processing by laser control unit
  3.7 Effect
  3.8 Other
4. Embodiment 2
  4.1 Configuration
  4.2 Operation
  4.3 Effect
  4.4 Other
5. Embodiment 3
  5.1 Configuration
  5.2 Operation
  5.3 Exemplary contents of processing by laser control unit
  5.4 Exemplary data of file B
  5.5 Effect
  5.6 Other
6. Exemplary excimer laser apparatus that uses solid-state laser device as oscillator
  6.1 Configuration
  6.2 Operation
  6.3 Description of semiconductor laser system
    6.3.1 Configuration
    6.3.2 Operation
    6.3.3 Other
  6.4 Effect
  6.5 Other
7. Hardware configurations of various control units
8. Electronic device manufacturing method
9. Other Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Terms

Terms used in the present disclosure are defined as described below.

A critical dimension (CD) is the dimension of a minute pattern formed on a wafer such as a semiconductor. In lithography, a CD value of a pattern changes under influence of the dimension of the pattern as well as surrounding patterns. Thus, the CD after exposure is different between, for example, a case in which a pattern is disposed in isolation on a reticle and a case in which the pattern is disposed adjacent to any other pattern. The degree of the difference changes with not only the distance between the other adjacent pattern, density, kind, and the like but also settings of an optical system of an exposure device used for exposure. Such an optical proximity effect is referred to as an OPE. Note that a proximity effect other than the optical proximity effect is obtained with an image development process or any other process at image development.

Figure 1:
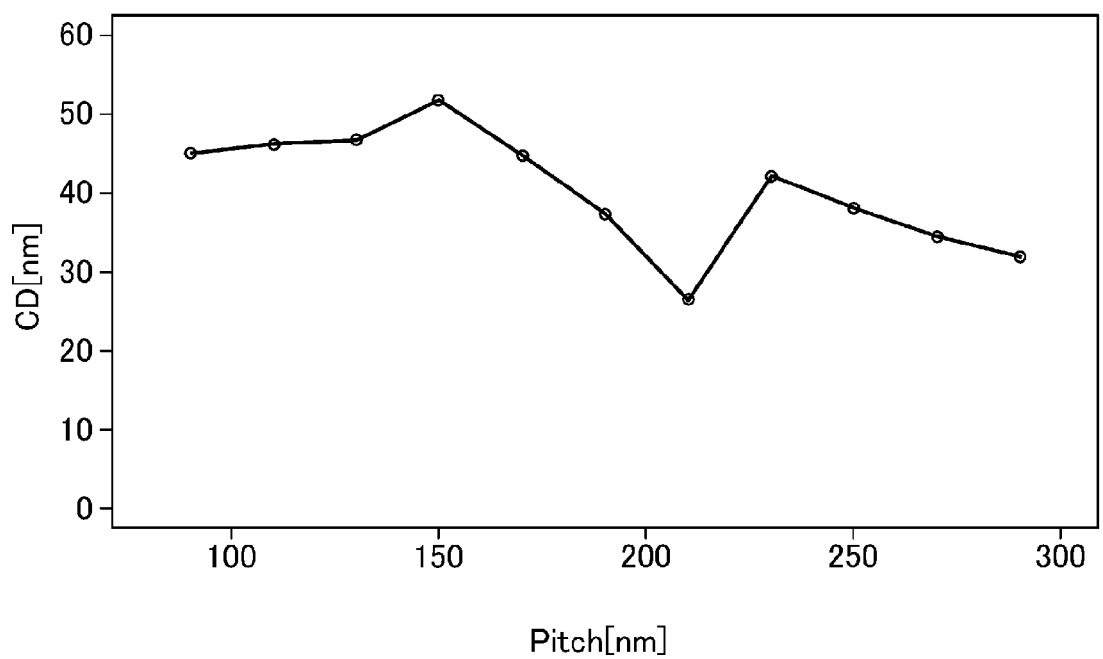
FIG. 1 illustrates an exemplary optical proximity effect (OPE) curve.

An OPE curve is a graph in which the kind of a pattern is plotted on the horizontal axis and the CD value or the difference between the CD value and a target CD value is plotted on the vertical axis. The OPE curve is also referred to as an OPE characteristic curve. FIG. 1 illustrates an exemplary OPE curve. In FIG. 1, the horizontal axis represents a through pitch, and the vertical axis represents the CD value. The through pitch is an exemplary pattern.

Optical proximity correction (OPC) is to provide bias and an auxiliary pattern to a reticle pattern based on exposure experiment data in advance so that the CD on a wafer after exposure becomes equal to a target value, since it is known that the CD value changes due to the OPE in some cases. The OPC is typically performed at the stage of process development by a device manufacturer.

OPE correction is correction different from the OPC. The OPE is also affected by settings of an optical system used for exposure, such as the numerical aperture (NA), illumination σ, and ring belt ratio of each lens, and thus the CD value can be adjusted to a target value by adjusting optical system parameters of an exposure apparatus. This adjustment is referred to as OPE correction. The CD value can be controlled by the OPC and the OPE correction. The OPC is often performed at the stage of process development including reticle production, and the OPE correction is often performed at (right before) or halfway through mass production after reticle production. In addition, a proximity effect such as micro loading effect other than the optical proximity effect is obtained with image development or the like, and the CD may be adjusted through optical system adjustment for such a proximity effect together with the optical proximity effect in some cases.

Overlay is overlay of a minute pattern formed on a wafer such as a semiconductor.

A spectrum line width Δλ is an index value of a spectrum line width that affects exposure performance. The spectrum line width Δλ may be, for example, a bandwidth with which the integral energy of a laser spectrum is 95%.

2. Overview of Exposure System According to Comparative Example

2.1 Configuration

Figure 2:
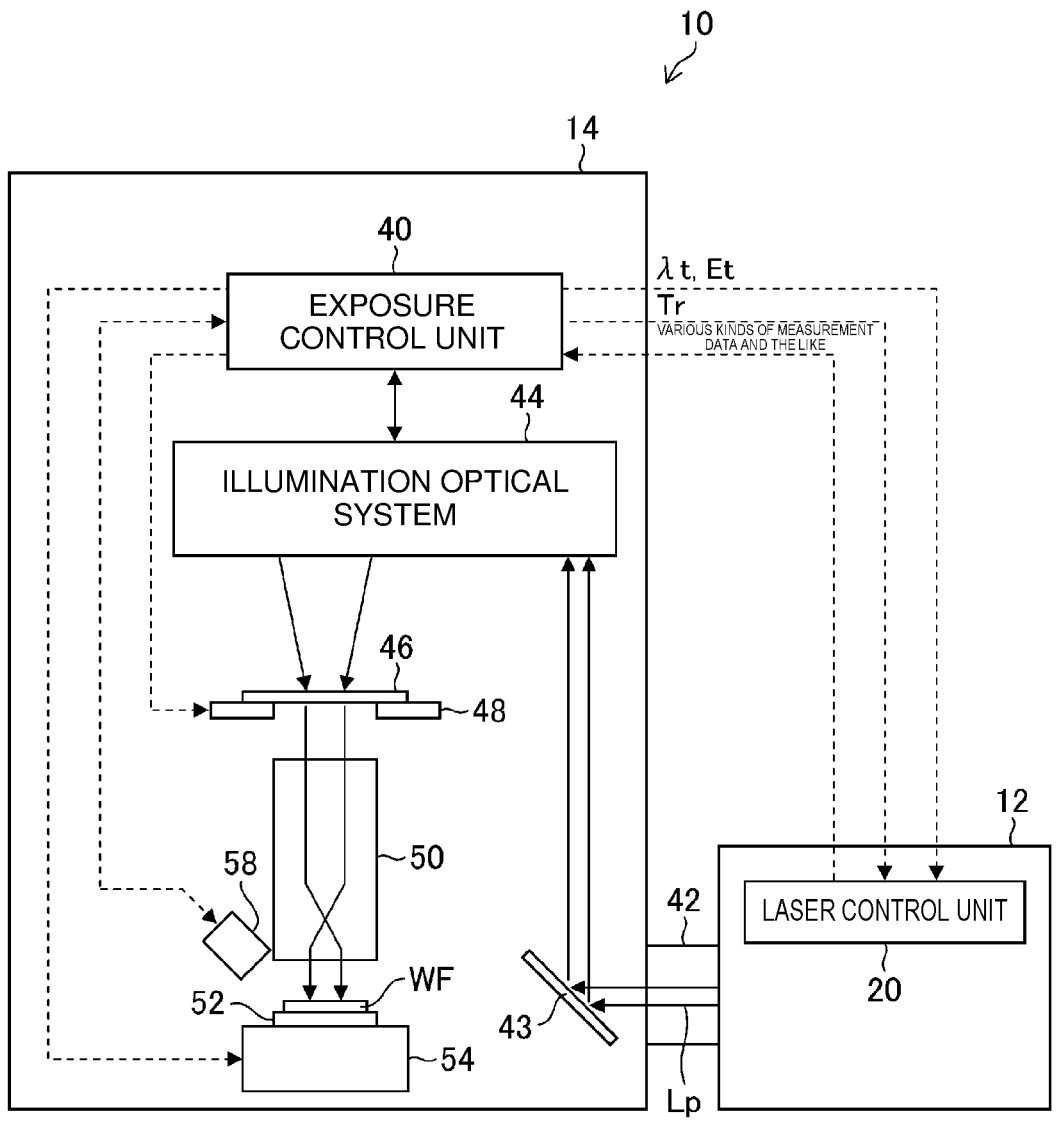
FIG. 2 schematically illustrates the configuration of an exposure system according to a comparative example.

FIG. 2 schematically illustrates the configuration of an exposure system 10 according to a comparative example. The comparative example of the present disclosure is an example that the applicant recognizes as known only by the applicant, but is not a publicly known example that is recognized by the applicant. The exposure system 10 includes a laser apparatus 12 and an exposure apparatus 14. The laser apparatus 12 is a variable-wavelength narrow-band oscillation ArF laser apparatus including a laser control unit 20, a non-illustrated laser chamber, and a non-illustrated line narrow module.

The exposure apparatus 14 includes an exposure control unit 40, a beam delivery unit (BDU) 42, a high reflective mirror 43, an illumination optical system 44, a reticle 46, a reticle stage 48, a projection optical system 50, a wafer holder 52, a wafer stage 54, and a focus sensor 58.

The wafer holder 52 holds a wafer WF. The illumination optical system 44 is an optical system through which a pulse laser beam is guided to the reticle 46. The illumination optical system 44 shapes the laser beam into a scanning beam having a substantially rectangular shape and uniform light intensity distribution. In addition, the illumination optical system 44 controls the incident angle of the laser beam on the reticle 46. The projection optical system 50 images a reticle pattern on the wafer WF. The focus sensor 58 measures the height of a wafer surface.

The exposure control unit 40 is connected to the reticle stage 48, the wafer stage 54, and the focus sensor 58. The exposure control unit 40 is also connected to the laser control unit 20. Each of the exposure control unit 40 and the laser control unit 20 is configured as a non-illustrated processor and includes a storage device such as a memory. The storage device may be mounted on the processor.

2.2 Operation

The exposure control unit 40 controls movement of the wafer stage 54 in a Z axial direction to correct a focus position in a wafer height direction (the Z axial direction) based on the height of the wafer WF, which is measured by the focus sensor 58.

By a step-and-scan scheme, the exposure control unit 40 transmits control parameters of a target laser beam to the laser control unit 20 and controls the reticle stage 48 and the wafer stage 54 while transmitting a light emission trigger signal Tr to perform scanning exposure of an image of the reticle 46 to the wafer WF. The control parameters of a target laser beam include, for example, a target wavelength λt and a target pulse energy Et. Note that the phrase "target laser beam" means "target pulse laser beam". "Pulse laser beam" is simply written as "laser beam" in some cases.

The laser control unit 20 controls a selection wavelength of the line narrow module so that the wavelength λ of a pulse laser beam emitted from the laser apparatus 12 becomes equal to the target wavelength λt. The laser control unit 20 also controls excitation intensity so that the pulse energy E of the pulse laser beam becomes equal to the target pulse energy Et. Accordingly, the laser control unit 20 causes emission of the pulse laser beam in accordance with the light emission trigger signal Tr. In addition, the laser control unit 20 transmits, to the exposure control unit 40, various kinds of measurement data of the pulse laser beam emitted in accordance with the light emission trigger signal Tr. The various kinds of measurement data include, for example, the wavelength λ and the pulse energy E.

2.3 Exemplary Exposure Operation on Wafer

Figure 3:
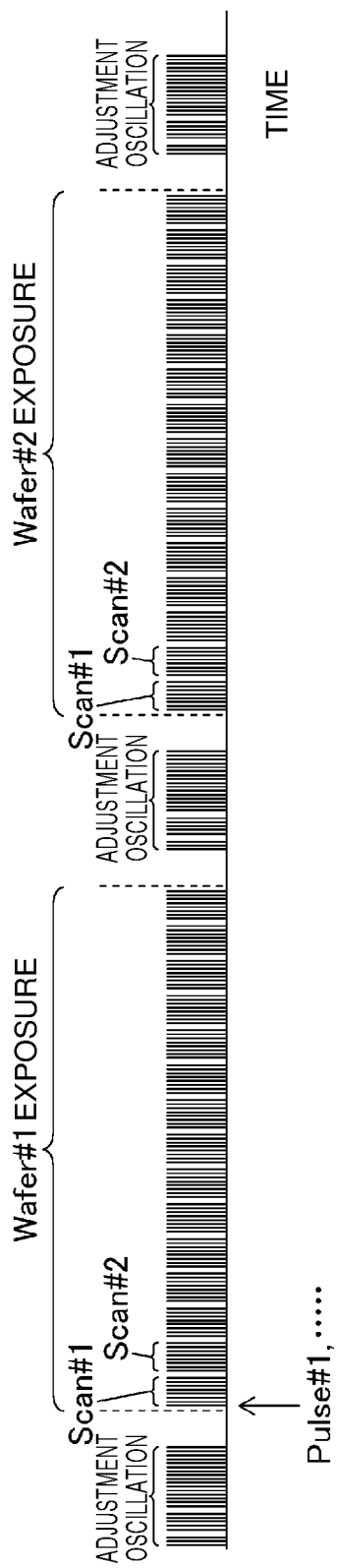
FIG. 3 illustrates an exemplary output pattern of a light emission trigger signal transmitted from an exposure control unit to a laser control unit.

FIG. 3 illustrates an exemplary output pattern of the light emission trigger signal Tr transmitted from the exposure control unit 40 to the laser control unit 20. In the example illustrated in FIG. 3, an actual exposure pattern starts, after adjustment oscillation is performed for each wafer WF. Specifically, the laser apparatus 12 first performs the adjustment oscillation and then performs burst operation for first wafer exposure (Wafer #1) after a predetermined time interval.

The adjustment oscillation is oscillation with emission of an adjustment pulse laser beam but no irradiation of the wafer WF with the pulse laser beam. The adjustment oscillation is performed under a predetermined condition until the laser is stabilized in a state in which exposure is possible, and is performed before lot of wafer production. A pulse laser beam Lp is emitted at a predetermined frequency of, for example, several hundreds Hz to several kHz approximately. In wafer exposure, it is typical to perform burst operation that repeats a burst duration and an oscillation stop duration. The burst operation is performed in the adjustment oscillation as well.

In FIG. 3, each interval in which pulses are closely spaced is the burst duration in which the pulse laser beam is continuously emitted for a predetermined duration. In FIG. 3, each interval in which no pulse exists is the oscillation stop duration. Note that, in the adjustment oscillation, the length of each continuous emission duration of pulses does not need to be constant, but continuous emission operation may be performed in continuous emission durations with different lengths for adjustment. After the adjustment oscillation is performed, followed by a relatively large time interval, the first wafer exposure (Wafer #1) is performed at the exposure apparatus 14.

The laser apparatus 12 stops oscillation during a step in exposure by the step-and-scan scheme and emits a pulse laser beam in accordance with the interval of the light emission trigger signal Tr during scanning. Such a pattern of laser oscillation is referred to as a burst oscillation pattern.

Figure 4:
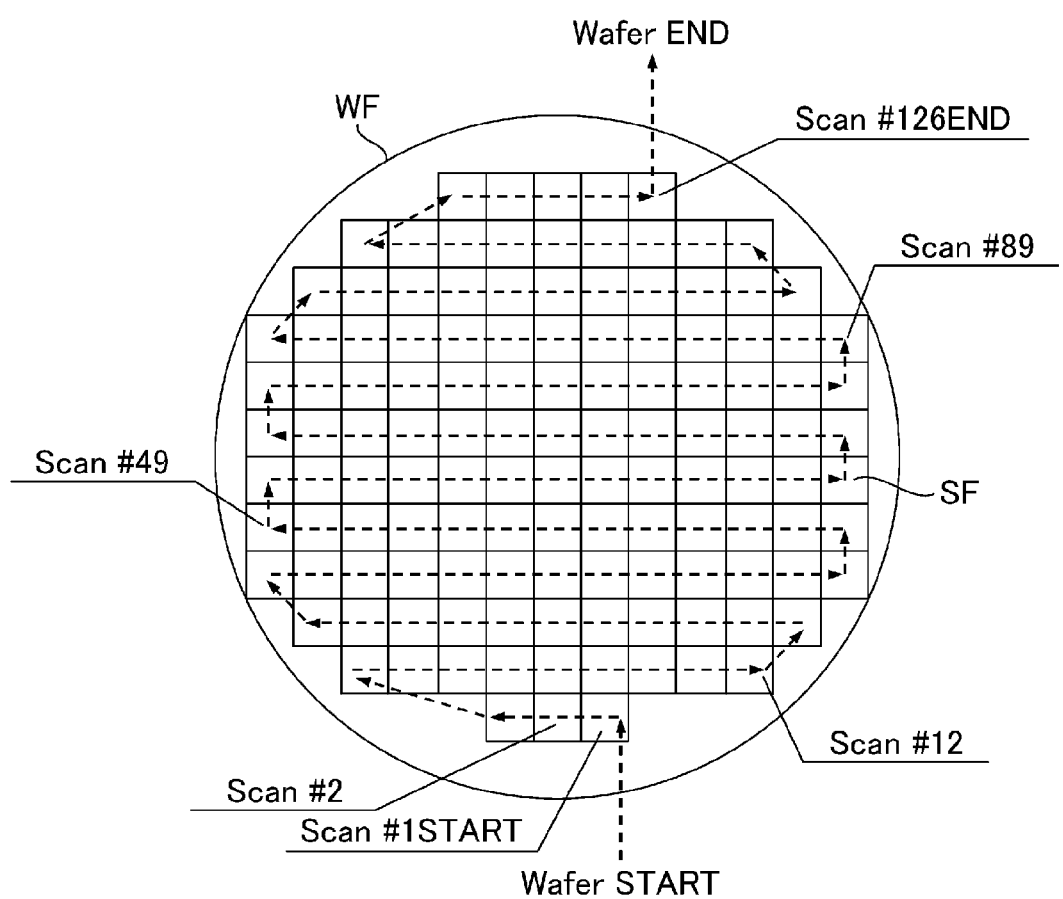
FIG. 4 illustrates an exemplary exposure pattern of step-and-scan exposure on a wafer.

FIG. 4 illustrates an exemplary exposure pattern of step-and-scan exposure on the wafer WF. Each of a plurality of rectangular regions illustrated in the wafer WF in FIG. 4 is a scanning field SF. The scanning field SF is an exposure region of one scanning exposure and also referred to as a scanning region. As illustrated in FIG. 4, wafer exposure is performed by dividing the wafer WF into a plurality of exposure regions (scanning fields) of a predetermined size and performing scanning exposure in each exposure region in a duration between start (Wafer START) and end (Wafer END) of the wafer exposure.

Specifically, the wafer exposure repeats steps such as the first scanning exposure (Scan #1) in a first predetermined exposure region of the wafer WF and the second scanning exposure (Scan #2) in a second predetermined exposure region. During one scanning exposure, a plurality of pulse laser beams Lp (Pulse #1, Pulse #2, . . . ) can be continuously emitted from the laser apparatus 12. After the scanning exposure (Scan #1) ends in the first predetermined exposure region, followed by a predetermined time interval, the scanning exposure (Scan #2) is performed in the second predetermined exposure region. When such scanning exposure is sequentially repeated and completed for all exposure regions of the first wafer WF, the adjustment oscillation is performed again and then wafer exposure (Wafer #2) of the second wafer WF is performed.

The step-and-scan exposure is performed in an order illustrated with dashed line arrows in FIG. 4, namely, Wafer START→Scan #1→Scan #2→ . . . →Scan #126→Wafer END. Each wafer WF is an example of a "semiconductor substrate" or a "photosensitive substrate" in the present disclosure.

2.4 Relation Between Scanning Field and Static Exposure Area

Figure 5:
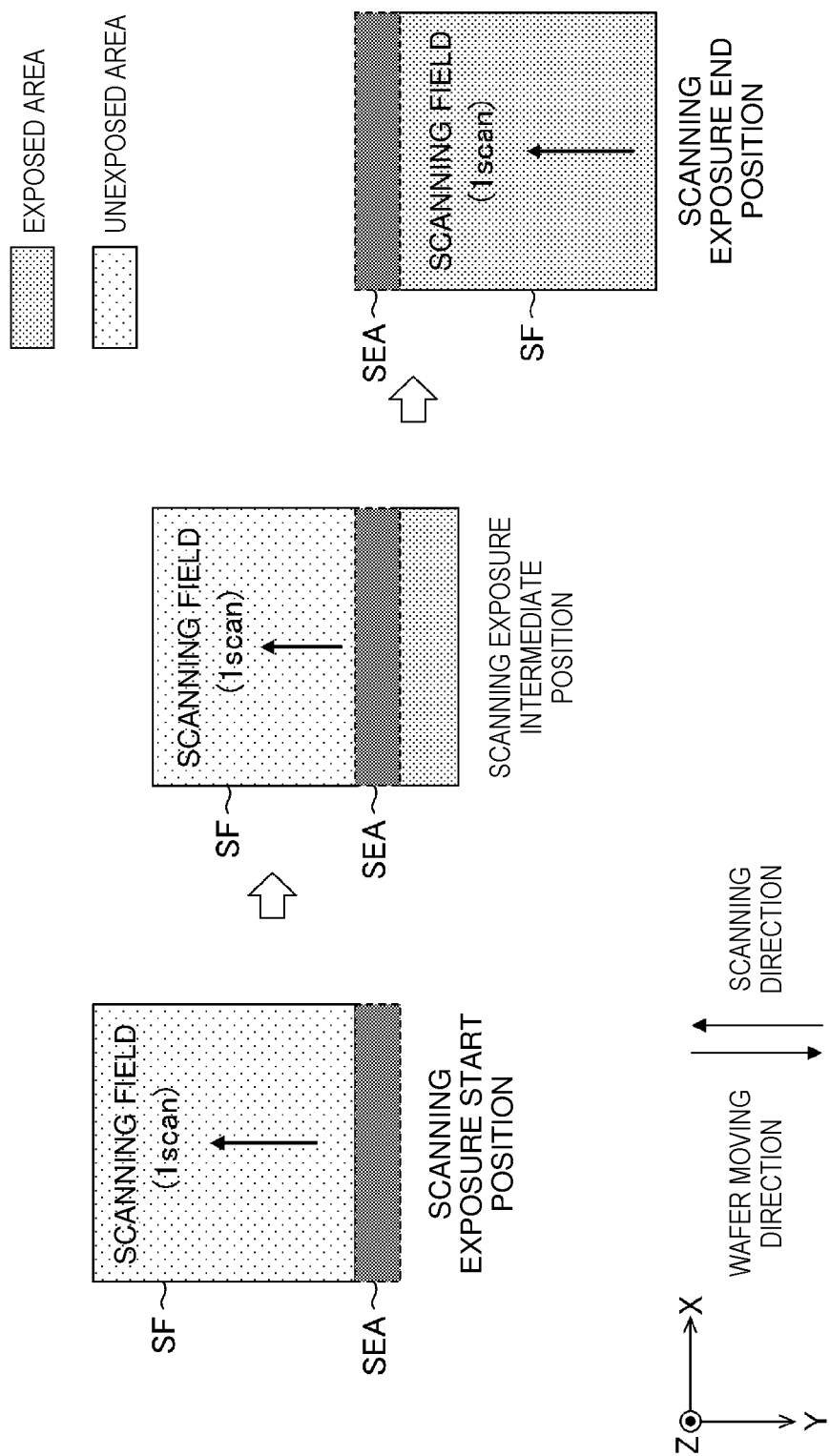
FIG. 5 illustrates the relation between one scanning field and a static exposure area on a wafer.

FIG. 5 illustrates the relation between one scanning field SF on the wafer WF and a static exposure area SEA. The static exposure area SEA is a beam irradiation region having a substantially rectangular shape and substantially uniform light intensity distribution and used for scanning exposure in the scanning field SF. Exposure is performed as the reticle 46 is irradiated with a substantially rectangular and substantially uniform scanning beam shaped through the illumination optical system 44 while the reticle 46 and the wafer WF are moved in mutually different directions along a short axial direction of the scanning beam (in this example, a Y axial direction) in accordance with a scaling-down ratio of the projection optical system 50. Accordingly, each scanning field SF on the wafer WF is subjected to scanning exposure to a reticle pattern. The static exposure area SEA can be understood as an area in which collective exposure by a scanning beam is possible.

In FIG. 5, a direction toward the negative Y axial direction side in the upward longitudinal direction is a scanning direction, and a direction toward the positive Y axial direction side is a wafer moving direction. A direction (X axial direction) parallel to the sheet of FIG. 5 and orthogonal to the Y axial direction is referred to as a scanning width direction. The size of each scanning field SF on the wafer WF is, for example, 33 mm in the Y axial direction and 26 mm in the X axial direction.

Figure 6:
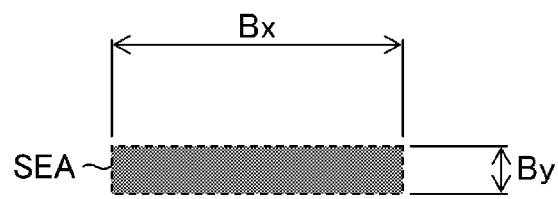
FIG. 6 is an explanatory diagram of the static exposure area.

FIG. 6 is an explanatory diagram of the static exposure area SEA. When Bx represents the length of the static exposure area SEA in the X axial direction and By represents the width of the static exposure area SEA in the Y axial direction, Bx corresponds to the size of each scanning field SF in the X axial direction and By is sufficiently smaller than the size of each scanning field SF in the Y axial direction. The width By of the static exposure area SEA in the Y axial direction is referred to as an N slit. The number $N_{SL}$ of pulses to which resist on the wafer WF is exposed is given by an expression below.

$$N_{SL}=(By/Vy) \cdot f$$

Vy: scanning speed of the wafer in the Y axial direction
f: laser repetition frequency (Hz)

Note that a scanning beam with which the reticle 46 is illuminated has, on the wafer WF, a size in accordance with magnification of the projection optical system 50 of the exposure apparatus 14. For example, when the magnification of the projection optical system 50 is ¼, the scanning beam with which the reticle 46 is illuminated has a size ¼ times larger on the wafer WF. A scanning field area on the reticle 46 is a scanning field SF having a size ¼ times larger on the wafer WF. The beam width (By width) of the scanning beam with which the reticle 46 is illuminated in the Y axial direction leads to the width By of the static exposure area SEA on the wafer WF in the Y axial direction.

2.5 Typical Process of OPE Correction

The OPE correction is processing that is performed after acquisition of the OPE curve (reference OPE curve) of a particular exposure apparatus as a reference and includes adjusting exposure conditions and the like of another exposure apparatus so that the OPE curve of the other exposure apparatus becomes closer to the reference OPE curve. The OPE correction is performed to correct a machine difference (individual difference) of an exposure apparatus. The particular exposure apparatus as a reference is referred to as a "reference exposure apparatus". The reference exposure apparatus is, for example, an exposure apparatus used in device development. The target exposure apparatus is, for example, an exposure apparatus used in mass production, and is an exposure apparatus for which matching adjustment is performed so that the OPE curve of the exposure apparatus becomes close to the reference OPE curve. The "other exposure apparatus" is referred to as a "matching exposure apparatus" in some cases.

Figure 7:
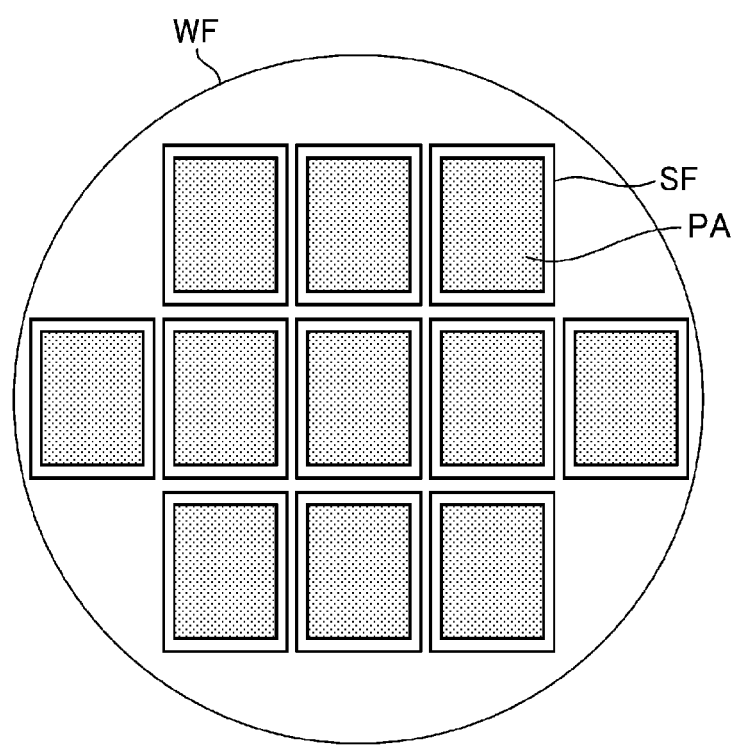
FIG. 7 is a schematic diagram exemplarily illustrating each scanning region on a wafer when OPE correction is performed.

FIG. 7 is a plan view schematically illustrating each scanning field SF on the wafer WF and a pattern region in the scanning field SF. The wafer WF includes a plurality of scanning fields SF, and the CD of every target pattern in each scanning field SF is typically measured when the OPE correction is performed. In many cases, for the plurality of scanning fields SF in the wafer WF, the CD of every target pattern existing in a pattern region PA of each scanning field SF is measured and an OPE curve representing the relation (OPE characteristic) between the pattern and the CD is obtained. Then, an average OPE curve is obtained by averaging the OPE curves obtained for the scanning fields SF. Settings of the exposure apparatus 14 and the like are adjusted so that the average OPE curve thus obtained becomes closer to the reference OPE curve.

Figure 8:
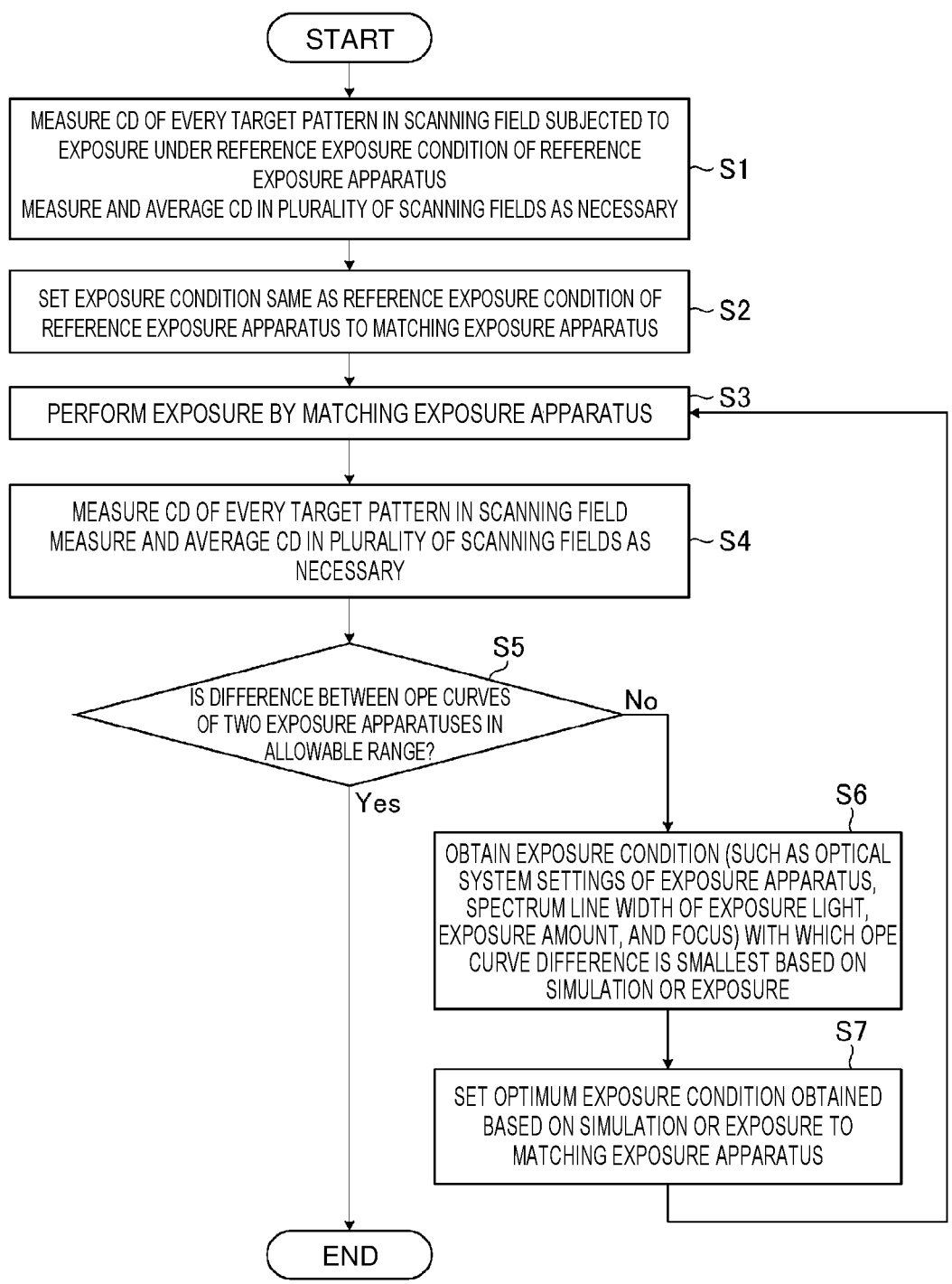
FIG. 8 is a flowchart illustrating an exemplary procedure of OPE correction.

FIG. 8 is a flowchart illustrating an exemplary procedure of the OPE correction. Some or all steps illustrated in FIG. 8 are implemented, for example, as a processor of a non-illustrated information processing device configured to manage parameters of the exposure apparatus 14 executes a program.

At step S1, the information processing device measures the CD of every target pattern in a scanning field SF, which is subjected to exposure under a reference exposure condition by using the reference exposure apparatus. In addition, the information processing device measures the CD in a plurality of scanning fields SF as necessary and calculates the average of the CDs. Note that a non-illustrated wafer examination device may be used for the CD measurement. The reference OPE curve is obtained as the processing at step S1 is performed.

Then at step S2, the information processing device sets an exposure condition same as the reference exposure condition to the matching exposure apparatus 14.

Then at step S3, the matching exposure apparatus 14 subjects the wafer WF to exposure under the set exposure condition.

Then at step S4, the information processing device measures the CD of every target pattern in the scanning region, which is obtained through the exposure at step S3. In addition, the information processing device measures the CDs in a plurality of scanning fields SF as necessary and calculates the average of the CDs. The OPE curve of the matching exposure apparatus 14 is obtained as the processing at step S4 is performed.

At step S5, the information processing device determines whether the difference between the OPE curves of the two exposure apparatuses is in an allowable range. The "two exposure apparatuses" are the reference exposure apparatus and the matching exposure apparatus 14. Thus, the information processing device determines whether the difference between the reference OPE curve obtained at step S1 and the OPE curve obtained at step S4 is in the allowable range. When the result of the determination at step S5 is "No", the information processing device proceeds to step S6.

At step S6, the information processing device obtains an exposure condition with which the OPE curve difference is smallest based on a simulation or based on a result of exposure actually performed under a changed exposure condition. The "exposure condition" includes optical system settings of the exposure apparatus 14, the spectrum line width of exposure light, an exposure amount, and focus. The optical system settings of the exposure apparatus 14 largely change with illumination system shapes such as the NA of each lens of the projection optical system 50 and the NA, illumination a, and ring belt ratio of each lens of the illumination optical system 44.

At step S7, the information processing device sets the exposure condition obtained at step S6 to the matching exposure apparatus 14. After step S7, the information processing device returns to step S3. When the result of the determination at step S5 is "Yes", the information processing device ends the flowchart in FIG. 8.

In this manner, the exposure condition of the matching exposure apparatus 14 is determined so that the difference between the OPE curve of the matching exposure apparatus 14 and the reference OPE curve of the reference exposure apparatus is in the allowable range. Note that step S1 in FIG. 8 may be performed by a processor that functions as an exposure control unit in the reference exposure apparatus. Steps S2 to S7 in FIG. 8 may be performed by a processor that functions as an exposure control unit in the matching exposure apparatus 14.

Figure 9:
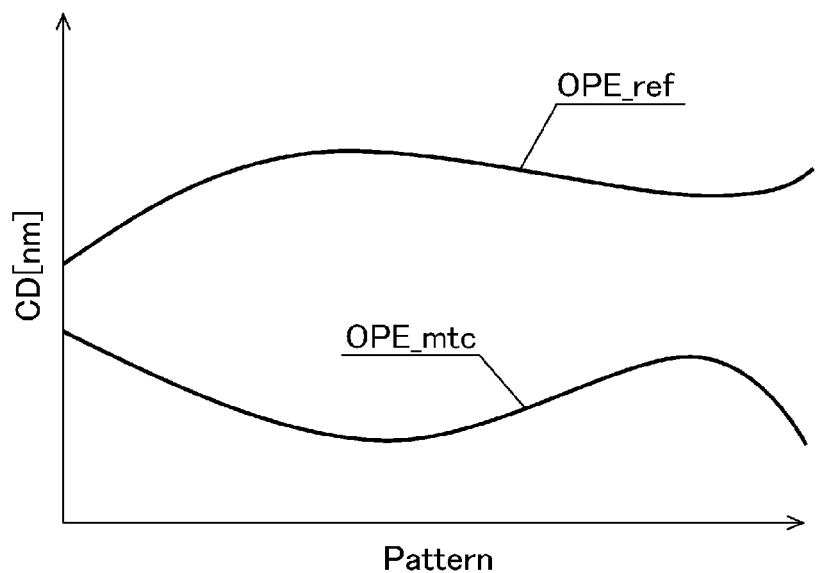
FIG. 9 is a graph illustrating an exemplary reference OPE curve obtained by measuring an exposure result of a reference exposure apparatus and an exemplary OPE curve obtained by measuring an exposure result of a matching exposure apparatus.

FIG. 9 is a graph illustrating an exemplary reference OPE curve obtained by measuring an exposure result of the reference exposure apparatus and an exemplary OPE curve obtained by measuring an exposure result of the matching exposure apparatus 14. In FIG. 9, the horizontal axis represents the kind of a pattern, and the vertical axis represents the CD. In FIG. 9, the graph OPE_ref is the reference OPE curve of the reference exposure apparatus, and the graph OPE_mtc is the OPE curve of the matching exposure apparatus 14.

2.6 Problem

Figure 10:
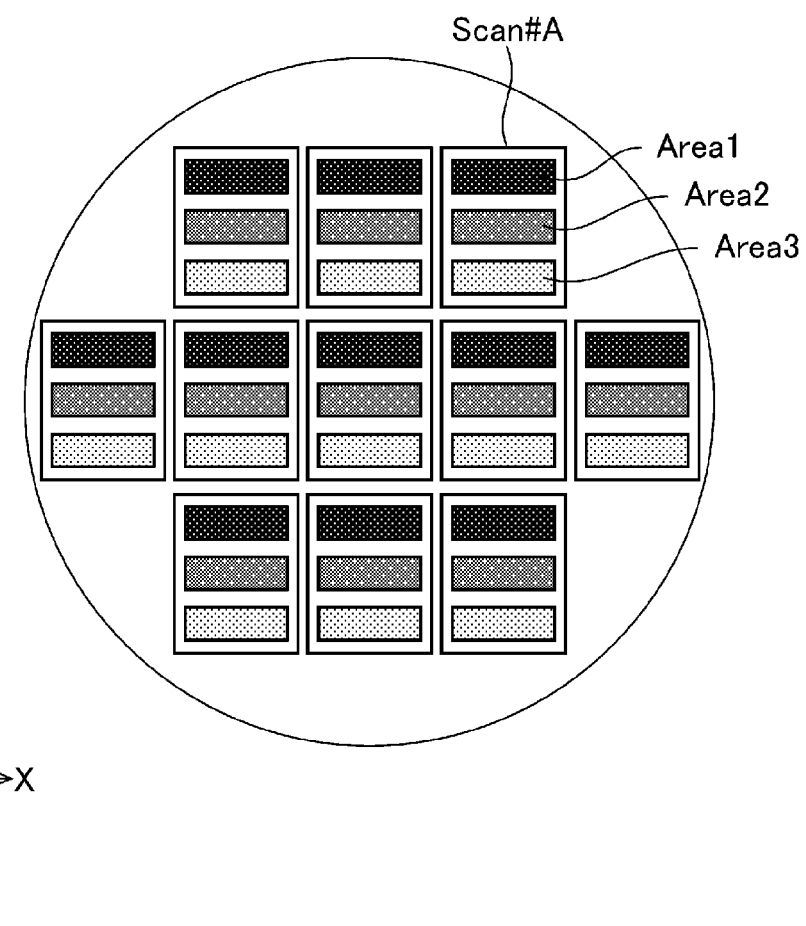
FIG. 10 is a schematic diagram schematically illustrating an exemplary pattern in each scanning field of a wafer.

FIG. 10 is a schematic diagram schematically illustrating an exemplary pattern in each scanning field SF of the wafer WF. Exposure in various patterns is performed in each scanning field SF, and the scanning field SF is divided into a plurality of partial areas in accordance with the kinds of the patterns. FIG. 10 illustrates an example in which a first partial area (Area1), a second partial area (Area2), and a third partial area (Area3) are provided in the scanning field SF. The form of pattern is different among the partial areas, and the OPE characteristic is different among the partial areas. Note that, the number, shapes, array form, and the like of partial areas in the scanning field SF are not limited to those in the example illustrated in FIG. 10.

Figure 11:
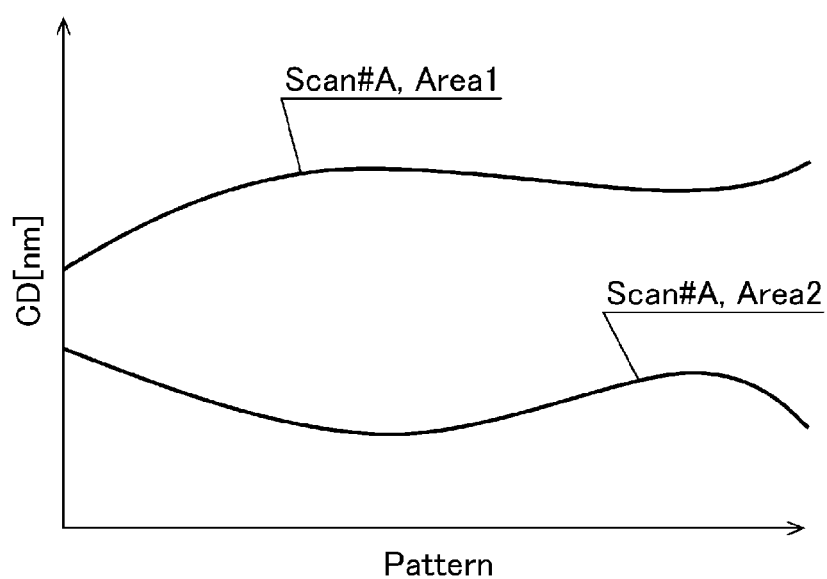
FIG. 11 illustrates exemplary OPE curves of a first partial area and a second partial area in one scanning field.

FIG. 11 illustrates exemplary OPE curves of the first partial area Area1 and the second partial area Area2 in a scanning field SF having a scanning number Scan #A. Since the OPE is different among patterns in exposure, it is desirable to obtain an optimum OPE characteristic for each partial area in the scanning field SF.

However, the typical OPE correction adjusts settings of the illumination optical system 44 and the projection optical system 50 of the exposure apparatus 14 as described with reference to FIGS. 7 to 9, and thus cannot adjust the illumination optical system 44 and the projection optical system 50 of the exposure apparatus 14 at high speed for a layer of an exposure process. As a result, it has been difficult to adjust the OPE characteristic halfway through scanning exposure.

3. Embodiment 1

3.1 Overview of Lithography System

3.1.1 Configuration

Figure 12:
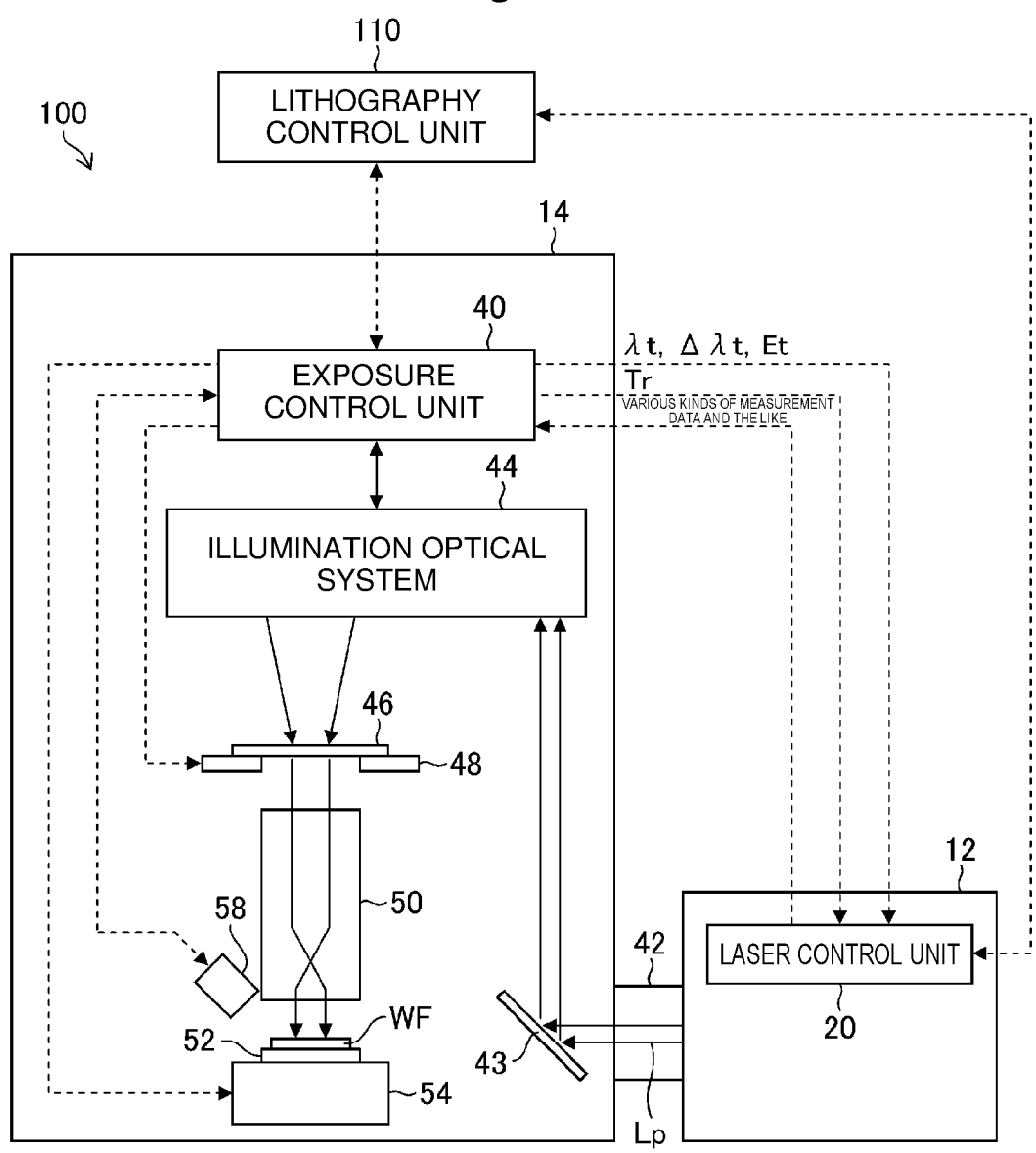
FIG. 12 illustrates an exemplary configuration of a lithography system according to Embodiment 1.

FIG. 12 illustrates an exemplary configuration of a lithography system 100 according to Embodiment 1. Description will be made on the difference of the configuration illustrated in FIG. 12 from the configuration illustrated in FIG. 2. The lithography system 100 illustrated in FIG. 12 includes a lithography control unit 110 in addition to the configuration illustrated in FIG. 2, and data transmission-reception lines are additionally provided between the lithography control unit 110 and the exposure control unit 40 and between the lithography control unit 110 and the laser control unit 20, respectively.

The lithography system 100 includes the laser apparatus 12, the exposure apparatus 14, and the lithography control unit 110. The lithography system 100 is an example of an "exposure system" in the present disclosure. In the lithography system 100, a target spectrum line width $\Delta\lambda t$ is added as a control parameter of a target laser beam. Data of the target spectrum line width $\Delta\lambda t$ is transmitted from the exposure control unit 40 to the laser control unit 20.

The lithography control unit 110 is configured as a non-illustrated processor. The lithography control unit 110 includes a storage device such as a memory. The processor may include the storage device.

A reticle pattern of the reticle 46 used in the lithography system 100 includes, for example, a plurality of partial areas corresponding to the plurality of partial areas (Area1 to Area3), respectively, described with reference to FIG. 10. The partial areas may be obtained, for example, through region division into strip-shaped regions that are continuous in a direction orthogonal to the scanning direction. Note that the shapes and number of partial areas are not limited to those in the example illustrated in FIG. 10.

A partial area of each scanning field SF is referred to as "Area(k)". The index k indicates an area number of the partial area. When the scanning field SF includes n partial areas, k is an integer of 1 to n. The partial areas of the scanning field SF correspond to partial areas of the reticle 46 on a one-to-one basis, and thus the partial area Area(k) can be understood as a partial area of the reticle 46. A large number of patterns are disposed in each partial area Area(k).

The lithography control unit 110 has a calculation program that calculates optimum laser-beam control parameters of each partial area Area(k). The calculation program includes a program that calculates line widths (in other words, the OPE) of a plurality of patterns based on a pure Fourier imaging optical theory by changing the settings of the exposure apparatus 14 and the laser-beam control parameters and calculates optimum settings of the exposure apparatus 14 and optimum laser-beam control parameters by using a mathematical method such as linear or non-linear optimization. Examples of parameters related to the settings of the exposure apparatus 14 include the NA of each lens of the projection optical system 50 and the illumination a and ring belt ratio of the illumination optical system 44.

3.1.2 Operation

The lithography control unit 110 calculates, by using the calculation program, optimum laser-beam control parameter values with which the OPE corresponding to each partial area Area(k) becomes closer to a reference OPE, and stores a result of the calculation in a file A. The laser-beam control parameter values stored in the file A include the value of a central wavelength, the value of a spectrum line width, and the value of pulse energy. The description "optimum control parameter values" means laser-beam control parameter values for the OPE curve corresponding to the partial area Area(k), the difference of which from the reference OPE curve is in an allowable range. An OPE curve, the difference of which from the reference OPE curve is in an allowable range, is referred to as an "optimum OPE curve" in some cases.

The lithography control unit 110 may receive data related to the laser apparatus 12 and including the laser-beam control parameters from the laser control unit 20 and may store the data. For example, the lithography control unit 110 receives data of the wavelength $\lambda$, the spectrum line width $\Delta\lambda$, and the pulse energy E from the laser control unit 20 and stores the data.

The exposure control unit 40 reads the laser-beam control parameter values corresponding to each partial area Area(k) of the scanning field SF of the wafer WF from the file A in the lithography control unit 110.

The exposure control unit 40 transmits the laser-beam control parameter values of each pulse at exposure in each partial area Area(k) to the laser apparatus 12. The following exposure operation may be the same as that of the exposure system 10 in FIG. 2. In addition, the spectrum line width $\Delta\lambda$ of each pulse can be varied by, for example, controlling a delay time $\Delta t$ between synchronization timings of an oscillator 22 and an amplifier 24 of the laser apparatus 12, which will be described later, for the pulse.

3.2 Exemplary laser apparatus

3.2.1 Configuration

Figure 13:
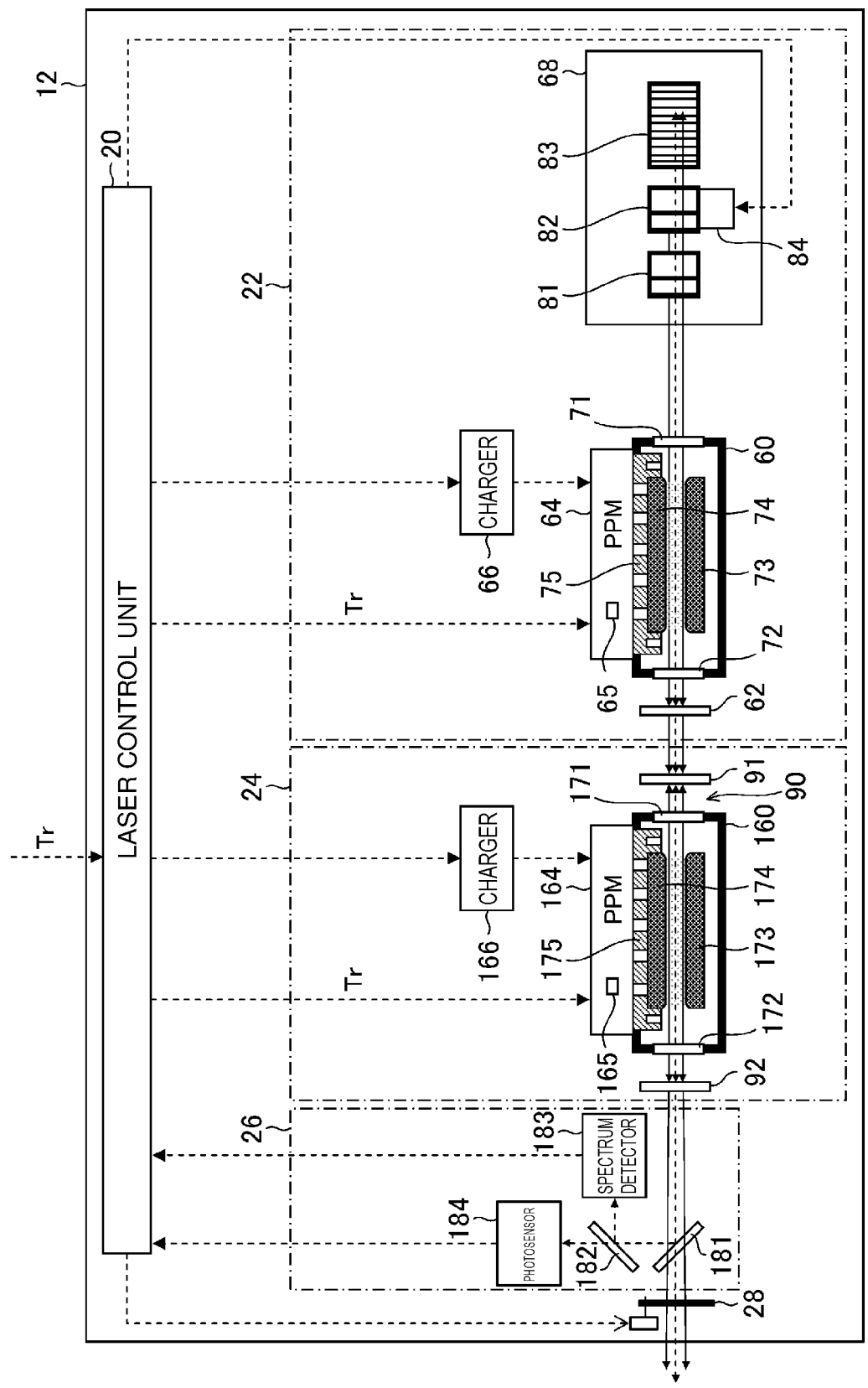
FIG. 13 illustrates an exemplary configuration of a laser apparatus.

FIG. 13 illustrates an exemplary configuration of the laser apparatus 12. The laser apparatus 12 illustrated in FIG. 13 is a line narrowing ArF laser apparatus including the laser control unit 20, the oscillator 22, the amplifier 24, a monitor module 26, and a shutter 28. The oscillator 22 includes a chamber 60, an output coupling mirror 62, a pulse power module (PPM) 64, a charger 66, and a line narrow module (LNM) 68.

The chamber 60 includes windows 71 and 72, a pair of electrodes 73 and 74, and an electrically insulating member 75. The PPM 64 includes a switch 65 and a non-illustrated charging capacitor and is connected to the electrode 74 via feed-through of the electrically insulating member 75. The electrode 73 is connected to the chamber 60 that is grounded. The charger 66 charges the charging capacitor of the PPM 64 in accordance with a command from the laser control unit 20.

The line narrow module 68 and the output coupling mirror 62 constitute an optical resonator. The chamber 60 is disposed so that a discharge region of the pair of electrodes 73 and 74 is disposed on the optical path of the resonator. The output coupling mirror 62 is coated with a multi-layered film that reflects part of a laser beam generated in the chamber 60 and transmits another part of the laser beam.

The line narrow module 68 includes two prisms 81 and 82, a grating 83, and a rotation stage 84 that rotates the prism 82. The line narrow module 68 changes the incident angle of a pulse laser beam on the grating 83 by rotating the prism 82 by using the rotation stage 84, and accordingly, controls the oscillation wavelength of the pulse laser beam. The rotation stage 84 may include a piezoelectric element capable of performing high-speed response so that response to each pulse is possible.

The amplifier 24 includes an optical resonator 90, a chamber 160, a PPM 164, and a charger 166. The configurations of the chamber 160, the PPM 164, and the charger 166 are the same as the configurations of the corresponding elements of the oscillator 22. The chamber 160 includes windows 171 and 172, a pair of electrodes 173 and 174, and an electrically insulating member 175. The PPM 164 includes a switch 165 and a non-illustrated charging capacitor.

The optical resonator 90 is a Fabry-Perot optical resonator constituted by a rear mirror 91 and an output coupling mirror 92. The rear mirror 91 partially reflects part of a laser beam and transmits another part of the laser beam. The output coupling mirror 92 partially reflects part of a laser beam and transmits another part of the laser beam. The reflectance of the rear mirror 91 is, for example, 80% to 90%. The reflectance of the output coupling mirror 92 is, for example, 10% to 30%.

The monitor module 26 includes beam splitters 181 and 182, a spectrum detector 183, and a photosensor 184 configured to detect pulse energy of a laser beam. The spectrum detector 183 may be, for example, an etalon spectrometer. The photosensor 184 may be, for example, a photodiode.

3.2.2 Operation

When having received data of the target wavelength $\lambda t$, the spectrum line width $\Delta\lambda t$, and the target pulse energy Et from the exposure control unit 40, the laser control unit 20 controls the rotation stage 84 of the LNM 68 so that an emission wavelength becomes equal to the target wavelength $\lambda t$, controls a scheme to be described later so that the target spectrum line width $\Delta\lambda t$ is obtained, and controls at least the charger 166 of the amplifier 24 so that the target pulse energy Et is obtained.

When having received the light emission trigger signal Tr from the exposure control unit 40, the laser control unit 20 provides a trigger signal to each of the switch 165 of the PPM 164 and the switch 65 of the PPM 64 so that a pulse laser beam emitted from the oscillator 22 discharges when entering a discharge space of the chamber 160 of the amplifier 24. As a result, the pulse laser beam emitted from the oscillator 22 is subjected to amplified oscillation at the amplifier 24. The amplified pulse laser beam is sampled by the beam splitter 181 of the monitor module 26 to measure the pulse energy E, the wavelength $\lambda$, and the spectrum line width $\Delta\lambda$.

The laser control unit 20 acquires data of the pulse energy E, the wavelength $\lambda$, and the spectrum line width $\Delta\lambda$ measured by using the monitor module 26. Then, the laser control unit 20 controls the charging voltage of the charger 166, the oscillation wavelength of the oscillator 22, and the discharge timings of the oscillator 22 and the amplifier 24 so that the difference between the pulse energy E and the target pulse energy Et, the difference between the wavelength $\lambda$ and the target wavelength $\lambda t$, and the difference between the spectrum line width $\Delta\lambda$ and the target spectrum line width $\Delta\lambda t$ each become closer to zero.

The laser control unit 20 can control the pulse energy E, the wavelength $\lambda$, and the spectrum line width $\Delta\lambda$ for each pulse. The spectrum line width $\Delta\lambda$ of the pulse laser beam emitted from the laser apparatus 12 can be controlled by controlling the delay time $\Delta t$ between the discharge timings of the chamber 60 of the oscillator 22 and the chamber 160 of the amplifier 24.

The pulse laser beam having transmitted through the beam splitter 181 of the monitor module 26 enters the exposure apparatus 14 through the shutter 28.

3.2.3 Other

Although the optical resonator 90 is a Fabry-Perot resonator in the example illustrated in FIG. 13, the amplifier may include a ring resonator.

3.4 Exemplary Contents of Processing by Lithography Control Unit

Figure 14:
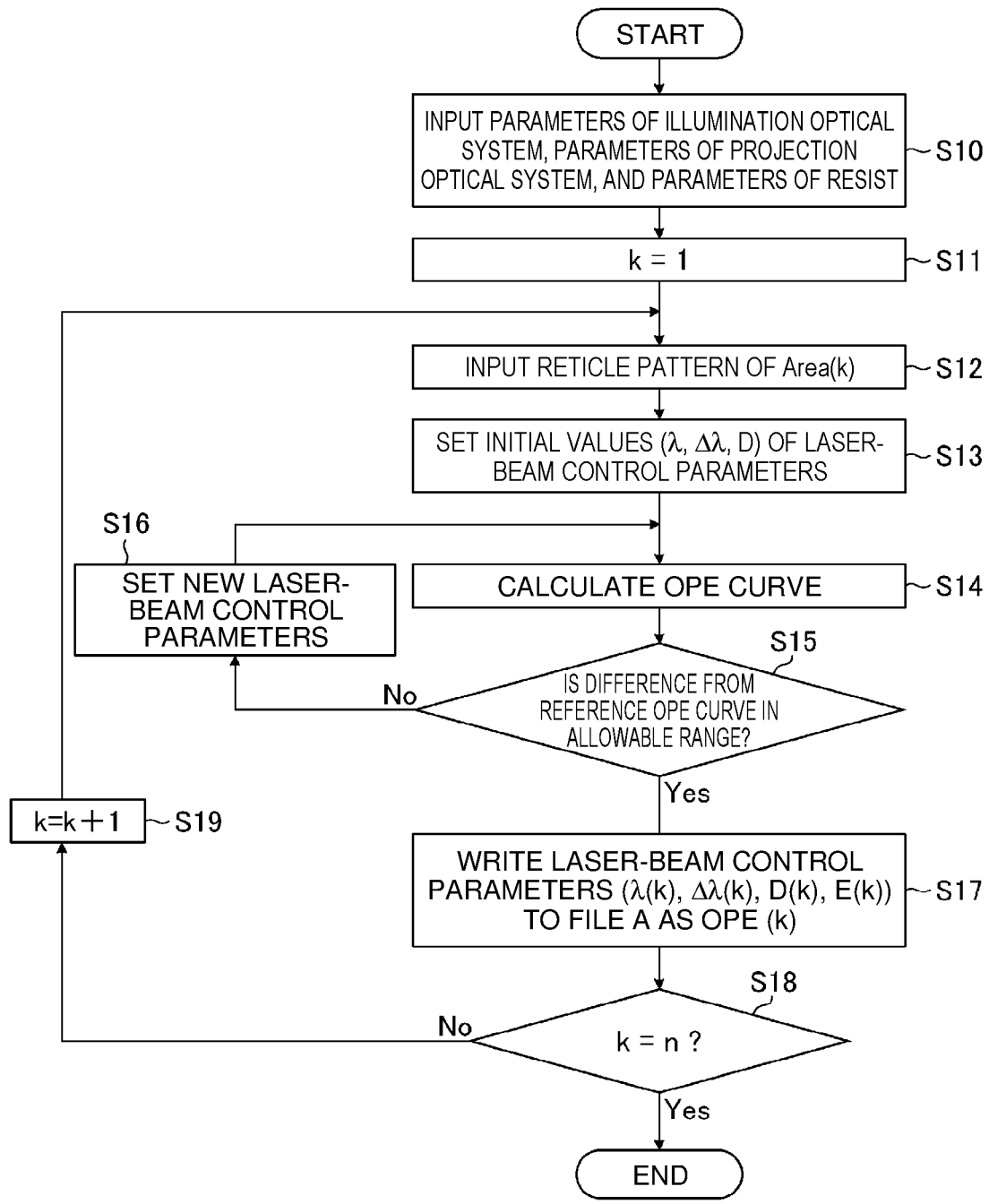
FIG. 14 is a flowchart illustrating exemplary processing performed by a lithography control unit of Embodiment 1.

FIG. 14 is a flowchart illustrating exemplary processing performed by the lithography control unit 110 of Embodiment 1. Steps illustrated in FIG. 14 are implemented through execution of a program by the processor that functions as the lithography control unit 110.

At step S10, the lithography control unit 110 receives input of data of parameters including parameters of the illumination optical system 44, parameters of the projection optical system 50, and parameters of resist.

Examples of the parameters of the illumination optical system 44 include the value of $\sigma$ and an illumination shape. Examples of the parameters of the projection optical system 50 include lens data and lens NA. Examples of the parameters of resist include sensitivity.

At step S11, the lithography control unit 110 initializes the index k, which indicates the area number of a partial area, to one. Note that k is an integer of 1 to 3 in the example illustrated in FIG. 10.

At step S12, the lithography control unit 110 receives input of pattern information on the reticle pattern of the partial area Area(k).

At step S13, the lithography control unit 110 sets initial values of the laser-beam control parameters. The laser-beam control parameters may be, for example, the wavelength $\lambda$, the spectrum line width $\Delta\lambda$, and an exposure amount (dose) D. Note that the pulse energy E may be used in place of or in addition to the exposure amount D.

The relation between the exposure amount D and the pulse energy E on the wafer surface is expressed by an expression below.

$$D = T \cdot E \cdot N_{SL}/(Bx \cdot By)$$

In the expression, T represents transmittance from the laser apparatus 12 to the wafer WF.

At step S14, the lithography control unit 110 calculates an OPE curve based on the input data. Specifically, the lithography control unit 110 calculates the OPE curve of the partial area Area(k) with given conditions in accordance with the calculation program.

At step S15, the lithography control unit 110 determines whether the absolute value of the difference between the OPE curve calculated at step S14 and the reference OPE curve is in an allowable range. Data of the reference OPE curve is acquired by using the reference exposure apparatus in advance and held at the lithography control unit 110. An indicator for evaluating the allowable range may be, for example, the sum of the absolute value of the difference between the CD values on the OPE curve and the reference OPE curve at each pattern, and the allowable range may be a predetermined range.

When the result of the determination at step S15 is "No", the lithography control unit 110 proceeds to step S16. At step S16, the lithography control unit 110 sets new values of the laser-beam control parameters and returns to step S14. Steps S14 to S16 are performed a plurality of times with different values of the laser-beam control parameters until the OPE curve, the difference of which from the reference OPE curve is in the allowable range, is obtained. The loop through steps S14 to S16 corresponds to processing of searching for a combination of laser-beam control parameter values with which an optimum OPE curve that is close to the reference OPE curve is obtained.

When the result of the determination at step S15 is "Yes", the lithography control unit 110 proceeds to step S17. At step S17, the lithography control unit 110 writes data of the laser-beam control parameters with which the OPE curve, the difference of which from the reference OPE curve is in the allowable range, is obtained to the file A as the OPE (k) indicating the OPE characteristic of the partial area Area(k). The data of the laser-beam control parameter written to the file A may be, for example, a combination of parameter values of the wavelength λ(k), the spectrum line width Δλ(k), the exposure amount D(k), and the pulse energy E(k) (refer to FIG. 15). The wavelength λ(k), the spectrum line width Δλ(k), the exposure amount D(k), and the pulse energy E(k) are each an example of a "laser control parameter" in the present disclosure. The exposure amount D(k) may be calculated from the product of pulse energy density on a non-illustrated wafer in the exposure apparatus 14 and the number $N_{SL}$ of pulses. The data may be received from the exposure control unit 40 by the lithography control unit 110.

At step S18, the lithography control unit 110 determines whether the value of the index k is equal to n. The number n is the number of partial areas in the scanning field SF and is an upper limit value (maximum value) that the index k takes. The number n is three in the example illustrated in FIG. 10.

When the result of the determination at step S18 is "No", the lithography control unit 110 increments the value of the index k (step S19) and returns to step S12.

When the result of the determination at step S18 is "Yes", the lithography control unit 110 ends the flowchart in FIG. 14. The method of calculating the laser control parameter in accordance with the flowchart in FIG. 14 is an example of a "laser control parameter production method" in the present disclosure.

FIG. 15 is a table listing exemplary data written to the file A. As illustrated in FIG. 15, the file A stores, for each of the partial areas Area(1) to Area(n), data of parameters such as the exposure amount D, the wavelength λ, the spectrum line width Δλ, and the pulse energy E with which an optimum OPE characteristic is obtained. For example, a method of calculating an optimum laser-beam control parameter of the OPE (k) of each partial area Area(k) calculates line widths (in other words, the OPE) of a plurality of patterns based on a pure Fourier imaging optical theory by changing the settings of the exposure apparatus 14 and/or the laser-beam control parameters and calculates optimum settings of the exposure apparatus 14 and optimum laser-beam control parameters by using a mathematical method such as linear or non-linear optimization. Examples of setting parameters of the exposure apparatus 14 include the NA of each lens and the illumination σ and ring belt ratio of the illumination optical system 44.

A reticle region corresponding to the partial area Area(1) is an example of a "first region" in the present disclosure, and a reticle region corresponding to the partial area Area(2) is an example of a "second region" in the present disclosure. Each of the partial area Area(1) and the partial area Area(2) is an example of "each of the regions" in the present disclosure. Among a plurality of partial areas, one partial area may correspond to the "first region" of the present disclosure, and another partial area may correspond to the "second region" of the present disclosure. The OPE curve is an example of a "proximity effect characteristic" in the present disclosure, and the reference OPE curve is an example of a "reference proximity effect characteristic" in the present disclosure. The file A is an example of a "first file" and a "file" in the present disclosure. An optimum OPE curve obtained for the partial area Area(1) is an example of a "first proximity effect characteristic" in the present disclosure. An optimum OPE curve obtained for the partial area Area(2) is an example of a "second proximity effect characteristic" in the present disclosure.

Control of the laser-beam control parameters so that an optimum OPE curve is obtained for each partial area Area(k) corresponds to correction of the OPE of each partial area in the scanning field SF with the laser-beam control parameters and is understood as a form of the OPE correction.

3.5 Exemplary Contents of Processing by Exposure Control Unit

Figure 16:
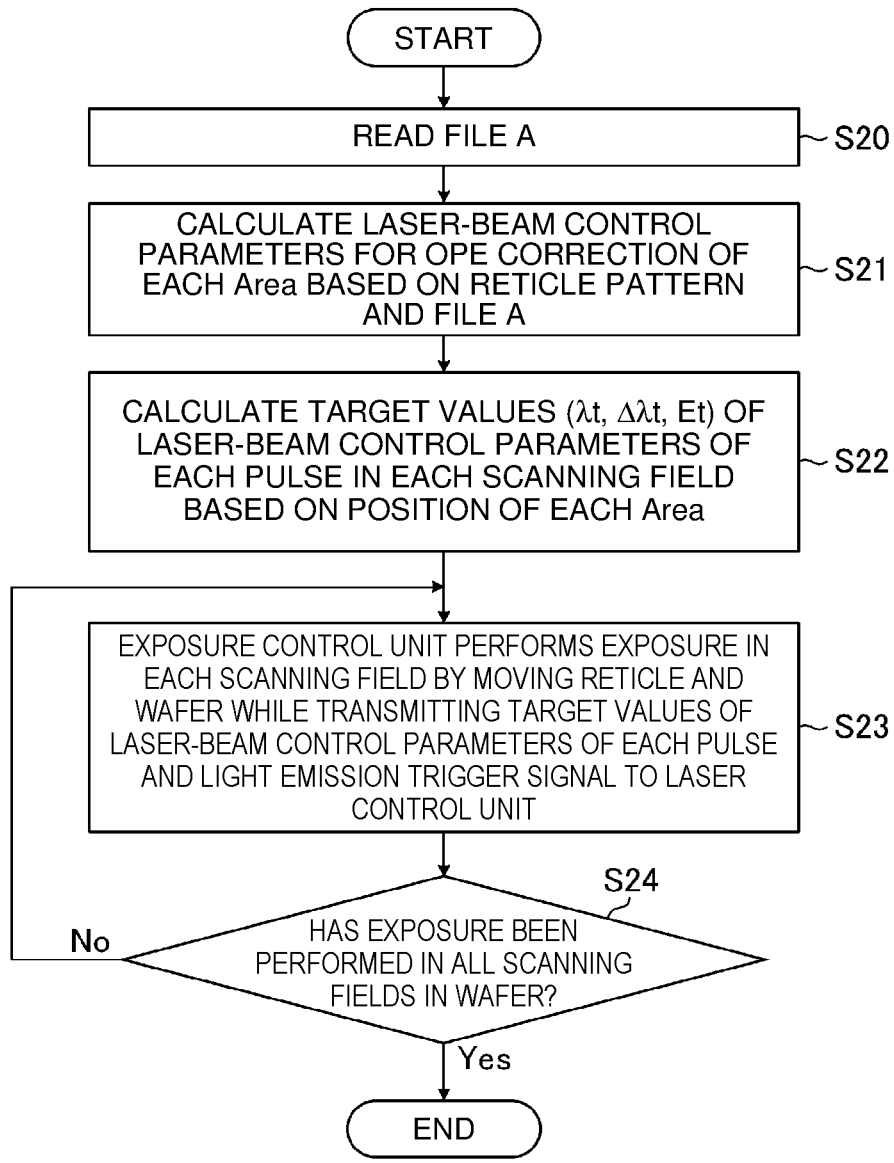
FIG. 16 is a flowchart illustrating exemplary processing performed by an exposure control unit of Embodiment 1.

FIG. 16 is a flowchart illustrating exemplary processing performed by the exposure control unit 40 of Embodiment 1. Steps illustrated in FIG. 16 are implemented through execution of a program by the processor that functions as the exposure control unit 40.

At step S20, the exposure control unit 40 reads data of the file A stored in the lithography control unit 110.

At step S21, the exposure control unit 40 calculates the laser-beam control parameters for the OPE correction of each partial area based on reticle pattern information and the data of the file A.

At step S22, the exposure control unit 40 calculates target values (λt, Δλt, and Et) of the laser-beam control parameters of each pulse in each scanning field SF based on the position of each partial area.

At step S23, the exposure control unit 40 performs exposure in each scanning field SF by moving the reticle 46 and the wafer WF while transmitting the target values (λt, Δλt, and Et) of the laser-beam control parameters of each pulse and the light emission trigger signal Tr to the laser control unit 20.

At step S24, the exposure control unit 40 determines whether exposure has been performed in all scanning fields SF in the wafer WF. When the result of the determination at step S24 is "No", the exposure control unit 40 returns to step S23. When the result of the determination at step S24 is "Yes", the exposure control unit 40 ends the flowchart in FIG. 16.

3.6 Exemplary Contents of Processing by Laser Control Unit

Figure 17:
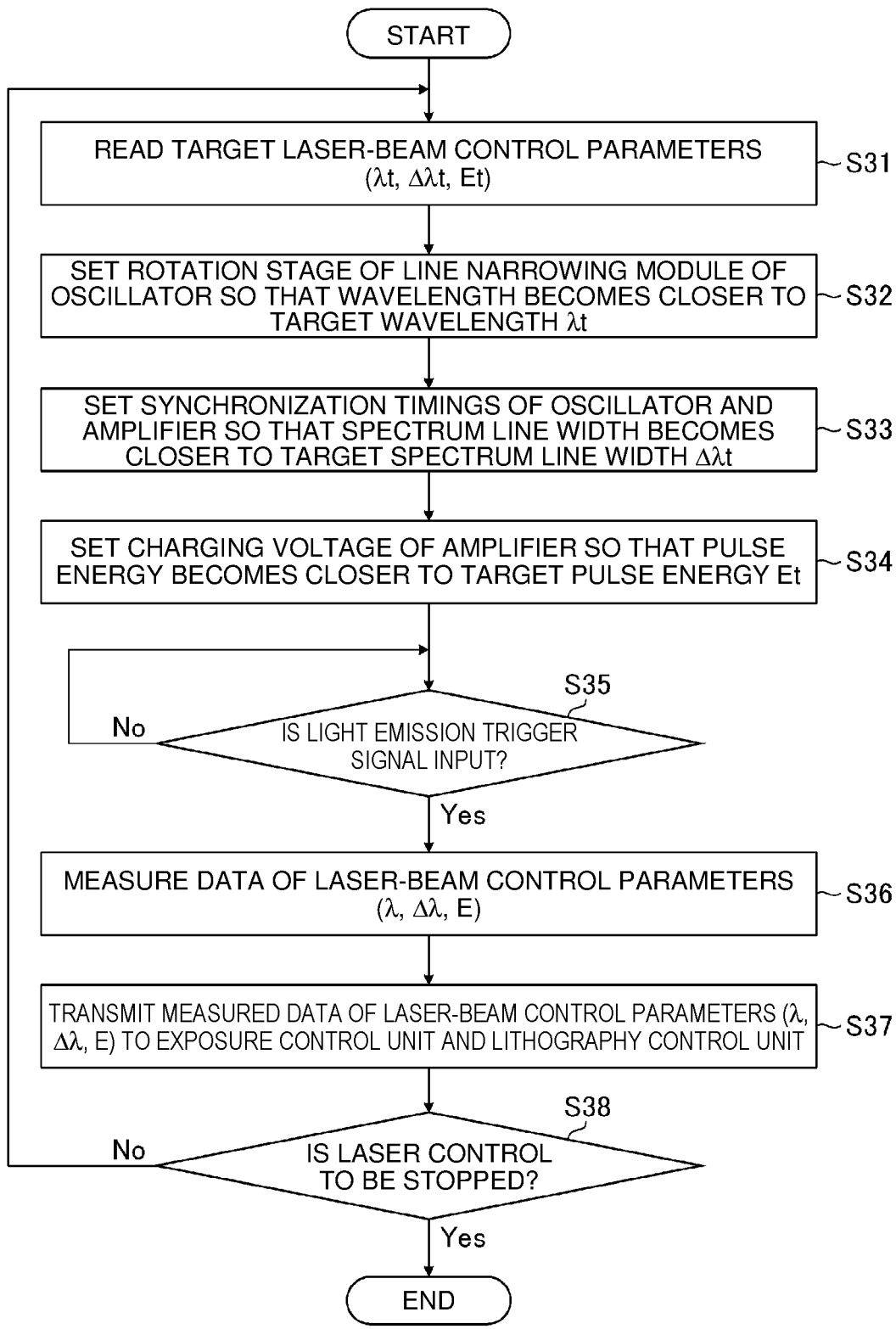
FIG. 17 is a flowchart illustrating exemplary processing performed by a laser control unit of Embodiment 1.

FIG. 17 is a flowchart illustrating exemplary processing performed by the laser control unit 20 of Embodiment 1. Steps illustrated in FIG. 17 are implemented through execution of a program by the processor that functions as the laser control unit 20.

At step S31, the laser control unit 20 reads data of the target laser-beam control parameters (λt, Δλt, and Et) transmitted from the exposure control unit 40.

At step S32, the laser control unit 20 sets the rotation stage 84 of the line narrow module 68 of the oscillator 22 so that the wavelength λ of a pulse laser beam emitted from the laser apparatus 12 becomes closer to the target wavelength λt.

At step S33, the laser control unit 20 sets the synchronization timings of the oscillator 22 and the amplifier 24 so that the spectrum line width Δλ of the pulse laser beam emitted from the laser apparatus 12 becomes closer to the target spectrum line width Δλt.

At step S34, the laser control unit 20 sets the charging voltage of the amplifier 24 so that the pulse energy E becomes closer to the target pulse energy Et.

At step S35, the laser control unit 20 waits for input of the light emission trigger signal Tr and determines whether the light emission trigger signal Tr is input. When the light emission trigger signal Tr is not input, the laser control unit 20 repeats step S35. When the light emission trigger signal Tr is input, the laser control unit 20 proceeds to step S36.

At step S36, the laser control unit 20 measures data of the laser-beam control parameters by using the monitor module 26. The laser control unit 20 acquires data of the wavelength λ, the spectrum line width Δλ, and the pulse energy E through the measurement at step S36.

At step S37, the laser control unit 20 transmits the data of the laser-beam control parameters measured at step S36 to the exposure control unit 40 and the lithography control unit 110.

At step S38, the laser control unit 20 determines whether to stop laser control. When the result of the determination at step S38 is "No", the laser control unit 20 returns to step S31. When the result of the determination at step S38 is "Yes", the laser control unit 20 ends the flowchart in FIG. 17.

The target wavelength λt, the target spectrum line width Δλt, and the target pulse energy Et that are set for a pulse laser beam with which the partial area Area(1) is to be irradiated are examples of a "first target wavelength", a "first target spectrum line width", and a "first target pulse energy" in the present disclosure. The pulse laser beam with which the partial area Area(1) is irradiated is an example of a "first pulse laser beam" in the present disclosure. Similarly, the target wavelength λt, the target spectrum line width Δλt, and the target pulse energy Et that are set for a pulse laser beam with which the partial area Area(2) is to be irradiated are examples of a "second target wavelength", a "second target spectrum line width", and a "second target pulse energy" in the present disclosure. The pulse laser beam with which the partial area Area(2) is to be irradiated is an example of a "second pulse laser beam" in the present disclosure. Transmission of data of the target wavelength λt, the target spectrum line width Δλt, and the target pulse energy Et from the exposure control unit 40 to the laser control unit 20 is an example of "instruction of the values of pulse-laser-beam control parameters to the laser apparatus" in the present disclosure.

3.7 Effect

The lithography system 100 according to Embodiment 1 adjusts the optical systems of the exposure apparatus 14 by performing the typical OPE correction described with reference to FIG. 8 and then additionally adjusts the laser-beam control parameters for the position of each partial area Area(k) in scanning exposure. With the lithography system 100 according to Embodiment 1, the laser-beam control parameters corresponding to an optimum OPE are determined for the pattern of each partial area Area(k) in each scanning field SF and exposure is performed with each pulse. Accordingly, the OPE characteristic, which is dependent on the position of scanning, can be adjusted at high speed.

Note that although the OPE characteristic is described in Embodiment 1, the description is also applicable to any other proximity effect characteristic and to correction performed so that an overall proximity effect characteristic including the OPE and the other proximity effect becomes closer to a reference characteristic.

3.8 Other

Embodiment 1 is described with an example in which functions of the lithography control unit 110 and the exposure control unit 40 are divided, but the present invention is not limited to this example and the exposure control unit 40 may have the function of the lithography control unit 110.

The calculation process as illustrated in FIG. 14 may be performed in advance by a computer on which the calculation program is installed, and the file A as illustrated in FIG. 15 may be stored in a storage unit of the lithography control unit 110 or the exposure control unit 40. The lithography control unit 110 may be a server configured to manage various parameters used for scanning exposure. The server may be connected to a plurality of exposure systems through a network. For example, the server is configured to perform the calculation process as illustrated in FIG. 14 and write calculated values of the control parameters to the file A in association with the corresponding partial area Area(k).

In Embodiment 1, calculation of the calculation process as illustrated in FIG. 14 is ended when the value of ΔCD has reached the allowable range, but the present invention is not limited to this example and further calculation may be performed to obtain the laser-beam control parameters with which the value of ΔCD is minimum.

Note that, in Embodiment 1, the value of ΔCD illustrated in FIG. 14 is the sum of the absolute value of the CD difference of each pattern, but the present invention is not limited to this example and the value of ΔCD may be, for example, a calculation value expressed by an expression below.

$$\Delta CD = \text{SQRT}\{(w1 \cdot \Delta CD1 + w2 \cdot \Delta CD2 + \ldots + wn \cdot \Delta CDn)/n\}$$

where wk represents a weight of a pattern k, ΔCDk represents the difference of the CD value of the pattern k from a reference value, and n represents the number of patterns.

4. Embodiment 2

4.1 Configuration

Figure 18:
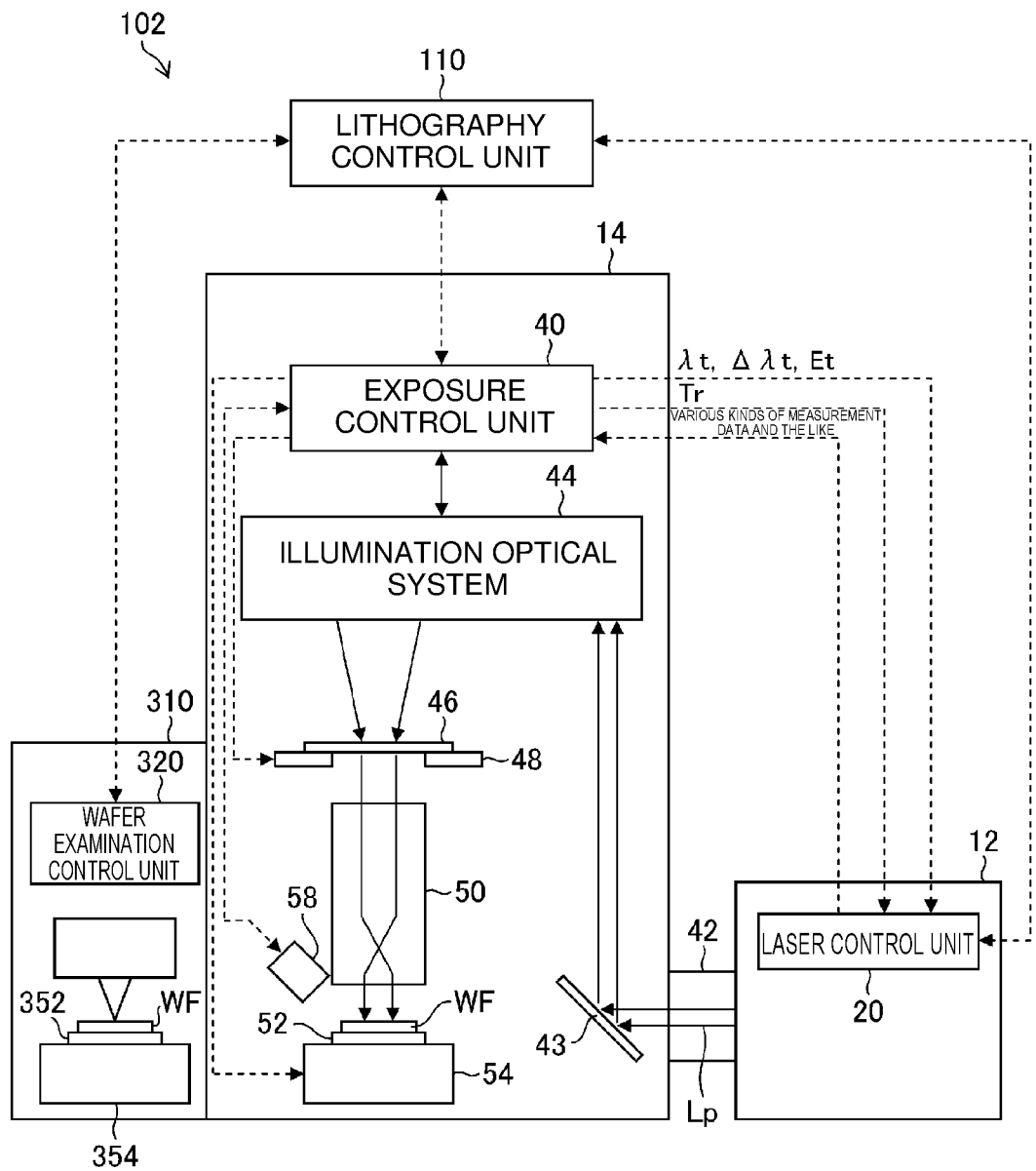
FIG. 18 illustrates an exemplary configuration of a lithography system according to Embodiment 2.

FIG. 18 illustrates an exemplary configuration of a lithography system 102 according to Embodiment 2. The lithography system 102 according to Embodiment 2 includes a wafer examination device 310 in addition to the configuration in FIG. 12. The other configuration may be the same as that of Embodiment 1. The wafer examination device 310 can measure the CD, the height of the wafer WF, and overlay by irradiating the wafer WF with a laser beam and measuring its reflected light or diffracted light. The wafer examination device 310 may be a high-resolution scanning electron microscope (SEM). The wafer examination device 310 includes a wafer examination control unit 320, a wafer holder 352, and a wafer stage 354. The wafer examination device 310 is an example of an "examination device" in the present disclosure.

The lithography control unit 110 is connected to a line through which data and the like are transmitted to and received from the wafer examination control unit 320.

4.2 Operation

The wafer WF having completed exposure using the exposure apparatus 14 is held by the wafer holder 352 of the wafer examination device 310 and subjected to various kinds of measurement by the wafer examination device 310. The lithography control unit 110 associates a pattern and a CD value at each position on the wafer WF, which are measured by the wafer examination device 310, with the laser-beam control parameters of exposure at the position.

The lithography control unit 110 calculates data of the laser-beam control parameters for optimum OPE correction at each partial area based on a result (pattern and CD) of actual exposure of the wafer WF and stores the data as the file A. The other operation is the same as that in Embodiment 1. The exposure-completed wafer WF as a target of examination by the wafer examination device 310 is an example of an "exposure-completed semiconductor substrate" in the present disclosure.

Figure 19:
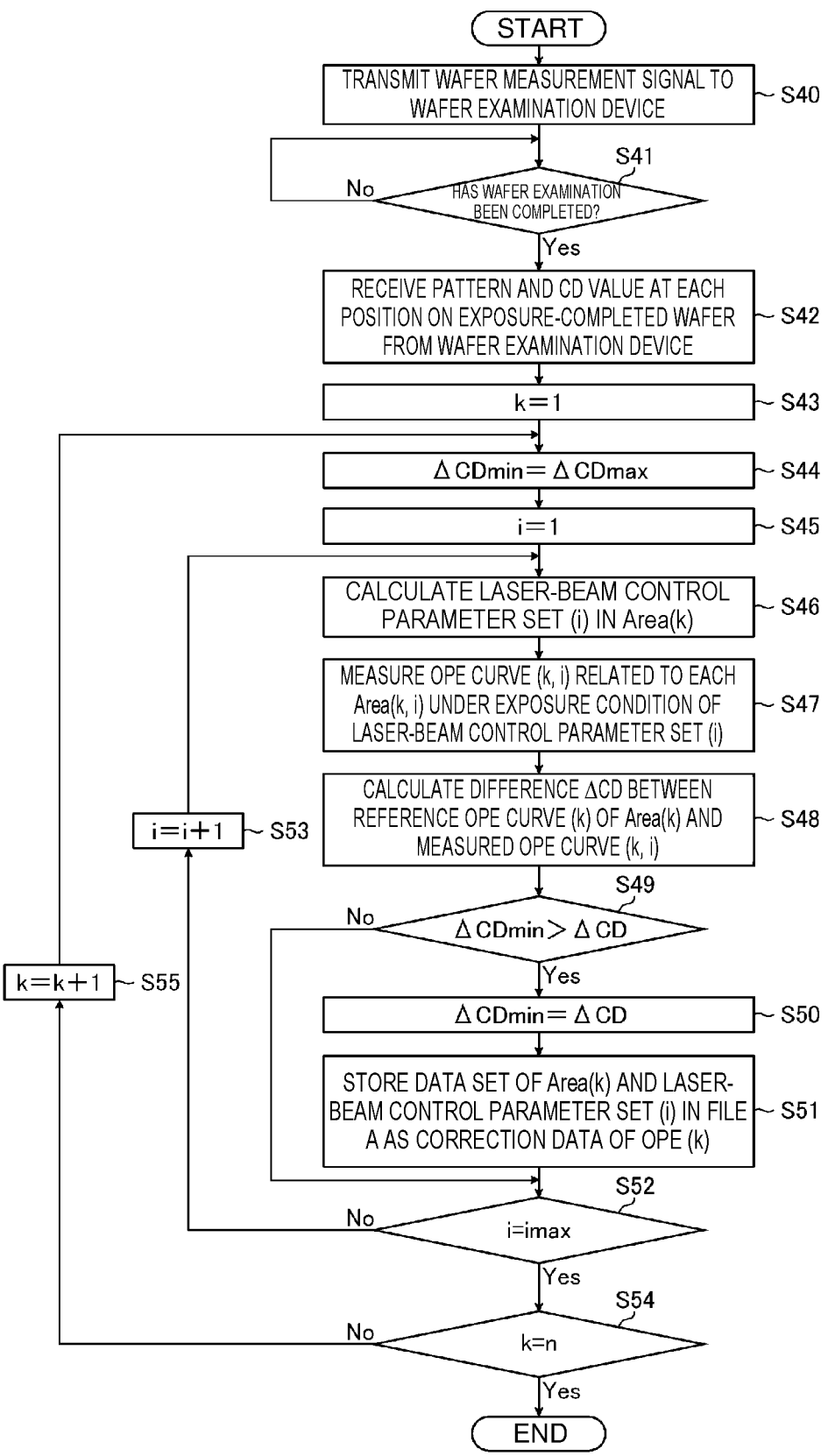
FIG. 19 is a flowchart illustrating exemplary processing at a lithography control unit of Embodiment 2.

FIG. 19 is a flowchart illustrating exemplary processing at the lithography control unit 110 of Embodiment 2.

At step S40, the lithography control unit 110 transmits a measurement signal for the wafer WF to the wafer examination device 310. The wafer examination device 310 performs measurement based on the measurement signal from the lithography control unit 110.

At step S41, the lithography control unit 110 determines whether examination of the wafer WF is completed. When having completed examination of the wafer WF, for example, the wafer examination device 310 transmits an examination completion signal indicating the examination completion to the lithography control unit 110. The lithography control unit 110 determines whether the examination is completed based on whether the examination completion signal is received.

When the result of the determination at step S41 is "No", the lithography control unit 110 waits at this step. When the result of the determination at step S41 is "Yes", the lithography control unit 110 proceeds to step S42.

At step S42, the lithography control unit 110 receives a pattern and a CD value at each position on the exposure-completed wafer WF from the wafer examination device 310. Data of a reticle pattern may be stored in advance when it is difficult to acquire pattern information from a result of measurement by the wafer examination device 310.

At step S43, the lithography control unit 110 sets one to the value of the index k.

Then at step S44, the lithography control unit 110 sets the value of ΔCDmax as an initial value of ΔCDmin. The value of ΔCDmin is the minimum value of the difference between a CD curve and a target CD curve. The value of ΔCDmax is the maximum value of the difference between the CD curve and the target CD curve.

Then at step S45, the lithography control unit 110 sets one to the value of an index i. The index i is a set number for identifying a set of laser-beam control parameters. The value of the index i indicates a data set (data combination) of the laser-beam control parameters.

At step S46, the lithography control unit 110 calculates a set (i) of laser-beam control parameters in the partial area Area(k). The lithography control unit 110 produces data of control parameters for each pulse of a laser beam in each scanning based on the number of the wafer WF, the scan number of the wafer WF, and the like from the exposure apparatus 14 and the laser apparatus 12 and stores the data in the file A. The set (i) of laser-beam control parameters in the partial area Area(k) can be obtained from the stored data.

At step S47, the lithography control unit 110 measures an OPE curve (k, i) related to each partial area Area(k, i) under an exposure condition of the set (i) of laser-beam control parameters.

At step S48, the lithography control unit 110 calculates the difference ΔCD between a reference OPE curve (k) of the partial area Area(k) and the measured OPE curve (k, i). The difference ΔCD may be, for example, the sum of the absolute value of the CD value difference of each pattern.

At step S49, the lithography control unit 110 determines whether ΔCDmin>ΔCD is satisfied. When the result of the determination at step S49 is "Yes", the lithography control unit 110 proceeds to step S50 and performs processing of replacing the value of ΔCDmin with ΔCD.

Then, at step S51, the lithography control unit 110 stores a data set of the partial area Area(k) and the set (i) of laser-beam control parameters in the file A as correction data of the OPE (k).

After step S51, the lithography control unit 110 proceeds to step S52. When the result of the determination at step S49 is "No", the lithography control unit 110 skips steps S50 to S51 and proceeds to step S52.

At step S52, the lithography control unit 110 determines whether the value of the index i is equal to a predetermined upper limit value imax. When the result of the determination at step S52 is "No", the lithography control unit 110 increments the value of the index i (step S53) and returns to step S46. When the result of the determination at step S52 is "Yes", the lithography control unit 110 proceeds to step S54.

At step S54, the lithography control unit 110 determines whether the value of the index k is equal to a predetermined value n. When the result of the determination at step S54 is "No", the lithography control unit 110 increments the value of the index k (step S55) and returns to step S44. When the result of the determination at step S54 is "Yes", the lithography control unit 110 ends the flowchart in FIG. 19.

Figure 20:
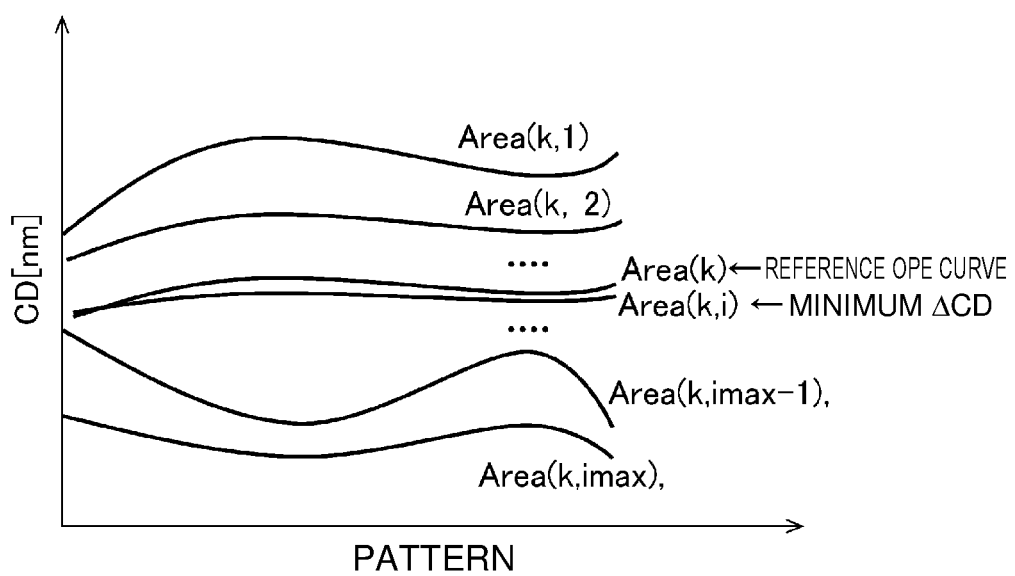
FIG. 20 illustrates an exemplary OPE curve for each set of laser-beam control parameters in a partial area Area(k).

FIG. 20 illustrates an exemplary OPE curve for each set (i) of laser-beam control parameters in the partial area Area(k). In FIG. 20, Area(k) denotes the reference OPE curve, and Area(k, i) denotes the OPE curve with which the value of ΔCD is minimum.

4.3 Effect

With the lithography system 102 according to Embodiment 2, the laser control parameters corresponding to an optimum OPE can be determined for the pattern of each partial area in each scanning field SF based on a result of actual exposure of the wafer WF, and exposure can be performed for each pulse.

As a result, error in the CD due to the individual difference (machine difference) of the exposure apparatus 14 can be corrected for an optimum OPE by adjusting the laser-beam control parameters. Thus, with the same reticle pattern, a desired resist pattern can be formed despite the individual difference of the exposure apparatus 14.

According to Embodiment 2, data of the file A can be constantly updated based on a result of actual exposure, and thus exposure can be performed with optimum laser-beam control parameters for each partial area, which are optimum for a current exposure process. As a result, stability of the CD value of a resist pattern improves.

4.4 Other

In Embodiment 2, data of the file A may be produced first by performing test exposure. Data of the file A is produced by performing test exposure through, for example, a procedure as follows.

[Procedure "a"] At each scanning of the wafer WF, scanning exposure is performed with a set of target laser-beam control parameters (λt, Δλt, and Et) set to constant target values. Then, the values of the set of target laser-beam control parameters (λt, Δλt, and Et) at the next scanning exposure are changed, and the scanning exposure is performed with constant target values. This change is repeated through scanning exposure.

[Procedure "b"] The first file A may be produced based on an examination result of the wafer WF subjected to exposure through Procedure "a" and the set (i) of laser-beam control parameters for the exposure.

5. Embodiment 3

5.1 Configuration

Figure 21:
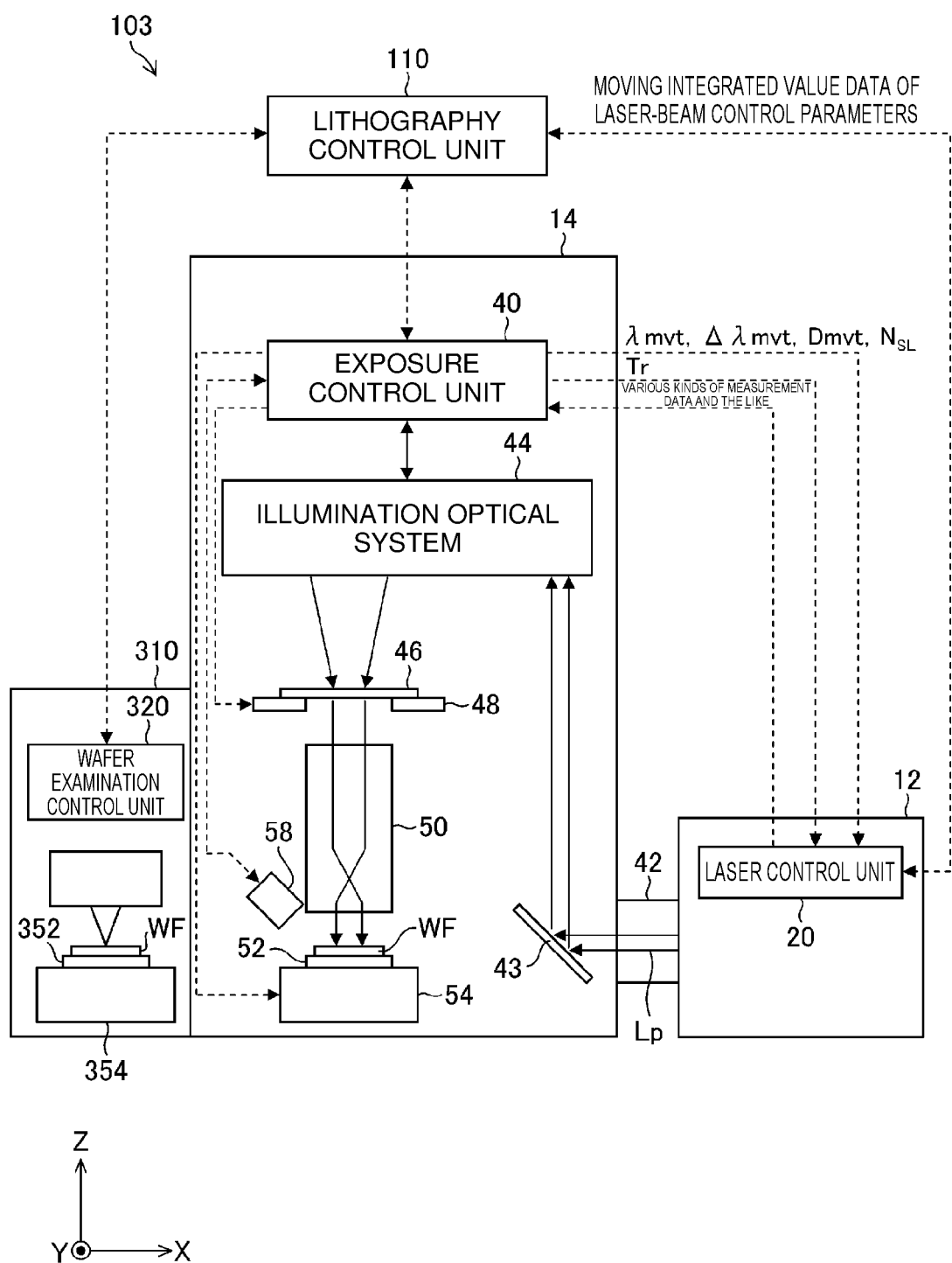
FIG. 21 illustrates an exemplary configuration of a lithography system according to Embodiment 3.

FIG. 21 illustrates an exemplary configuration of a lithography system 103 according to Embodiment 3. Description will be made on the difference of the configuration illustrated in FIG. 21 from the configuration illustrated in FIG.

18. In the lithography system 103 illustrated in FIG. 21, moving integrated values are used in place of the target laser-beam control parameters. Specifically, a moving integrated value λmvt of a target wavelength, a moving integrated value Δλmvt of a target spectrum line width, and a moving integrated value Dmvt of target pulse energy are used in place of the target wavelength λt, the target spectrum line width Δλt, and the target pulse energy Et as the target laser-beam control parameters transmitted from the exposure control unit 40 to the laser control unit 20. The exposure control unit 40 transmits the moving integrated values of the target laser-beam control parameters as well as information of the number $N_{SL}$ of pulses, which corresponds to the number of samples of moving integration, to the laser control unit 20. The other configuration is the same as that in FIG. 18.

In the present specification, moving integrated values of the laser-beam control parameters are defined as described below.

Regarding spectrum parameters, a wavelength and a spectrum line width that are calculated from a spectrum waveform obtained through moving integration with the number $N_{SL}$ of samples as described later are represented by λmv and Δλmv.

Regarding pulse energy parameters, the integrated value of pulse energy, which is obtained through moving integration with the number $N_{SL}$ of samples, is represented by Dmv.

Target values of these parameters are represented by λmvt, Δλmvt, and Dmvt, respectively.

5.2 Operation

The lithography control unit 110 in FIG. 21 associates a pattern and a CD value at each position on the wafer WF, which are measured by the wafer examination device 310, with the laser-beam control parameters (moving integrated values) of exposure at the position.

The lithography control unit 110 calculates data of the laser-beam control parameters (moving integrated values) for optimum OPE correction at each partial area based on a result (pattern and CD) of actual exposure of the wafer WF and stores data of a result of the calculation as a file A2. In the data stored in the file A2, the laser-beam control parameters are moving integrated values.

The laser control unit 20 receives target laser-beam control parameters (moving integrated values), calculates a target spectrum waveform F(λ)t and a target pulse energy Et of the next pulse, and controls the laser apparatus 12 so that these target values are achieved.

5.3 Exemplary Contents of Processing by Laser Control Unit

Figure 22:
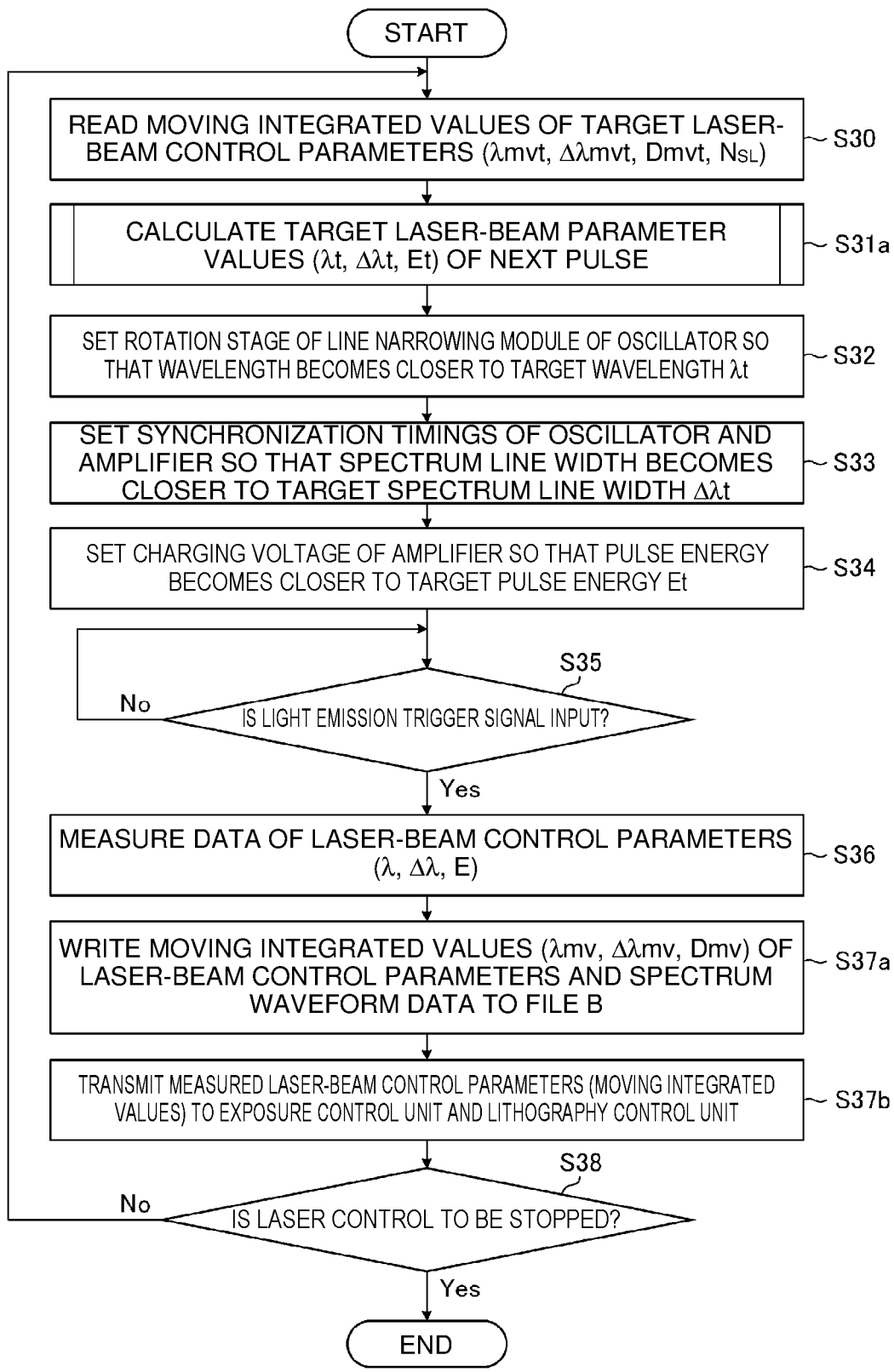
FIG. 22 is a flowchart illustrating exemplary processing performed by a laser control unit of Embodiment 3.

FIG. 22 is a flowchart illustrating exemplary processing performed by the laser control unit 20 of Embodiment 3. Description will be made on the difference of the flowchart illustrated in FIG. 22 from the flowchart illustrated in FIG. 17. The flowchart illustrated in FIG. 22 includes steps S30 and S31a in place of step S31 in FIG. 17. The flowchart illustrated in FIG. 22 also includes steps S37a and S37b in place of step S37 in FIG. 17.

At step S30, the laser control unit 20 reads data of the moving integrated values of the target laser-beam control parameters, which is transmitted from the exposure control unit 40. The data acquired by the laser control unit 20 includes data of λmvt, Δλmvt, Dmvt, and $N_{SL}$.

At step S31a, the laser control unit 20 calculates target laser-beam parameter values (λt, Δλt, and Et) of the next pulse. Exemplary processing contents applied to step S31a will be described later with reference to FIGS. 23 and 24. Steps S32 to S36, following step S31a, are the same as those in FIG. 17.

At step S37a after step S36, the laser control unit 20 writes the moving integrated values (λmv, Δλmv, and Dmv) of the laser-beam control parameters and spectrum waveform data to a file B. Exemplary data stored in the file B will be described later with reference to FIG. 25.

Then at step S37b, the laser control unit 20 transmits measured moving integrated values of the laser-beam control parameters to the exposure control unit 40 and the lithography control unit 110. After step S37b, the process proceeds to step S38. The subsequent steps are the same as those in FIG. 17.

Figure 23:
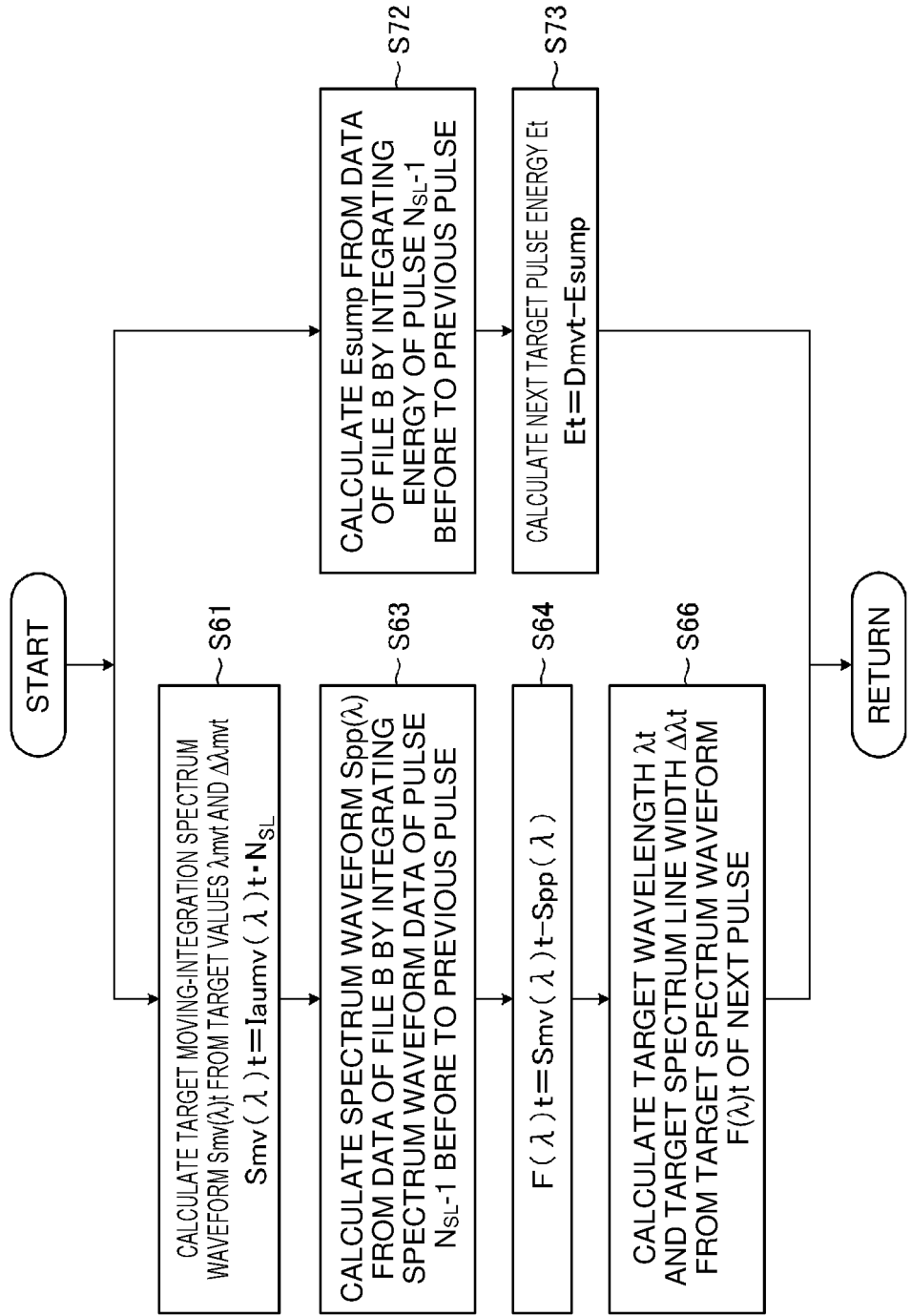
FIG. 23 is a flowchart illustrating exemplary processing contents applied to step S31a in FIG. 22.

FIG. 23 is a flowchart illustrating the exemplary processing contents applied at step S31a in FIG. 22. FIG. 24 illustrates exemplary spectrum waveforms obtained at calculation steps illustrated in FIG. 23.

At step S61 in FIG. 23, the laser control unit 20 performs conversion into a target normalized spectrum waveform Iaumv(λ)t with the target values λmvt and Δλmvt. The target normalized spectrum waveform Iaumv(λ)t is calculated through approximation based on the moving integrated value λmvt of the target wavelength and the moving integrated value λmvt of the target spectrum line width. Note that the spectrum line width may be a spectrum width in which 95% of energy is included.

A waveform diagram illustrated at the top of FIG. 24 illustrates the target normalized spectrum waveform Iaumv(λ)t calculated at step S61. The spectrum waveform of a normal excimer laser can be approximate to a spectrum waveform of the Lorentz distribution, the Gaussian distribution, or an intermediate distribution between the Lorentz distribution and the Gaussian distribution.

Then, the laser control unit 20 calculates a target moving-integration spectrum waveform Smv(λ)t. The target moving-integration spectrum waveform Smv(λ)t is expressed by an expression below.

$$Smv(\lambda)t = Iaumv(\lambda)t \cdot N_{SL}$$

A waveform diagram illustrated second from the top of FIG. 24 illustrates an example of the target moving-integration spectrum waveform Smv(λ)t calculated at step S61.

At step S63, the laser control unit 20 calculates a spectrum waveform Spp(λ) from data of the file B by integrating spectrum waveform data of a pulse $N_{SL}-1$ before to the previous pulse. A waveform diagram illustrated third from the top of FIG. 24 illustrates an example of the spectrum waveform Spp(λ) calculated at step S63. A waveform illustrated with a dashed line in a graph of the spectrum waveform Spp(λ) in FIG. 24 is a measured spectrum waveform of the previous pulse.

Then at step S64, the target spectrum waveform F(λ)t of the next pulse is calculated from the difference between the target moving-integration spectrum waveform Smv(λ)t and Spp(λ). The target spectrum waveform F(λ)t is expressed by an expression below.

$$F(\lambda)t = Smv(\lambda)t - Spp(\lambda)$$

A waveform diagram illustrated at the bottom of FIG. 24 illustrates an example of the target spectrum waveform F(λ)t of the next pulse, which is calculated at step S64.

Then at step S66, the laser control unit 20 calculates the target wavelength λt and the target spectrum line width Δλt from the target spectrum waveform F(λ)t of the next pulse.

The laser control unit 20 performs processing at steps S72 to S73 in parallel to or concurrently with the processing at steps S61 to S66.

At step S72, the laser control unit 20 calculates Esump from data of the file B by integrating energy of a pulse $N_{SL}-1$ before to the previous pulse.

At step S73, the laser control unit 20 calculates the target pulse energy Et from the difference between Dmvt and Esump.

$$Et=Dmvt-Esump$$

After steps S66 and S73, the laser control unit 20 ends the flowchart in FIG. 23 and returns to the main flow in FIG. 22.

5.4 Exemplary Data of File B

FIG. 25 is a table listing exemplary data written to the file B. As illustrated in FIG. 25, the file B records, in association with time-point data TIME for each pulse, a record including data of the pulse energy E, the integrated value Dmv of moving-integration pulse energy, the wavelength $\lambda$, the wavelength $\lambda$mv of a moving-integration spectrum waveform, the spectrum line width $\Delta\lambda$, the spectrum line width $\Delta\lambda$mv of the moving-integration spectrum waveform, and a spectrum waveform $F(\lambda)$.

The wavelength $\lambda mv(z-N_{SL}+1)$ of the moving-integration spectrum waveform and the spectrum line width $\Delta\lambda mv(z-N_{SL}+1)$ of the moving-integration spectrum waveform are values calculated from a spectrum waveform $Smv(\lambda)$ obtained by integrating light intensity at each wavelength based on data of the spectrum waveform $F(\lambda)$ of a pulse $(z-N_{SL}+1)$ to a pulse z. The file B is an example of a "second file" in the present disclosure. The values of the pulse energy E, the wavelength $\lambda$, and the spectrum line width $\Delta\lambda$ illustrated in FIG. 25 are each an example of a "measured value of a pulse-laser-beam control parameter" in the present disclosure.

5.5 Effect

In the lithography system 103 according to Embodiment 3, the laser-beam control parameter values of exposure in each scanning field SF are moving integrated values in a precise sense.

A laser beam emitted from the laser apparatus is controlled by calculating target values of the laser-beam control parameters of the next pulse so that the laser-beam control parameters become equal to target moving integrated values.

As a result, exposure can be performed with the laser-beam control parameters (moving integrated values) for optimum OPE correction at each partial area.

5.6 Other

In Embodiment 3, the wavelength $\lambda mv(z-N_{SL}+1)$ of the moving-integration spectrum waveform and the spectrum line width $\Delta\lambda mv(z-N_{SL}+1)$ of the moving-integration spectrum waveform are calculated based on an actually measured spectrum waveform, but the present invention is not limited to this example. For example, an approximate expression may be calculated from a measured wavelength $\lambda$ and a measured spectrum line width $\Delta\lambda$ and stored as data of the file A.

In Embodiment 3, the laser apparatus 12 receives the moving integrated values ($\lambda$mvt, $\Delta\lambda$mvt, and Dmvt) and the number $N_{SL}$ of pulses of moving integration as the laser-beam control parameters, and the laser control unit 20 calculates target laser-beam control parameters ($\lambda$t, $\Delta\lambda$t, and Et) of the next pulse and controls the laser apparatus 12, but the present invention is not limited to this example. For example, such calculation may be performed at the lithography control unit 110, and target laser-beam control parameters ($\lambda$t, $\Delta\lambda$t, and Et) for each pulse may be transmitted to the laser control unit 20 directly or through the exposure control unit 40. Alternatively, the calculation may be performed at the exposure control unit 40, and target laser-beam control parameters ($\lambda$t, $\Delta\lambda$t, and Et) for each pulse may be directly transmitted to the laser control unit 20.

In Embodiment 3, the moving-integration wavelength $\lambda$mv and the moving-integration spectrum line width $\Delta\lambda$mv are calculated from the moving-integration spectrum waveform $Smv(\lambda)$ over the number $N_{SL}$ of samples, but the present invention is not limited to this example. The same wavelength $\lambda$mv and the same spectrum line width $\Delta\lambda$mv can be calculated from a moving average spectrum $Fmv(\lambda) = Smv(\lambda)/N_{SL}$.

In addition, the integrated value Dmv of moving-integration pulse energy over the number $N_{SL}$ of samples is calculated, but the present invention is not limited to this example. Moving average pulse energy $Emv=Dmv/N_{SL}$ may be obtained from Dmv and used as a pulse-laser-beam control parameter.

Thus, in the present specification, the moving integrated value of a pulse-laser-beam control parameter is synonymous with the moving average value of the pulse-laser-beam control parameter. Specifically, a wavelength $\lambda$mv, a spectrum line width $\Delta\lambda$mv, and moving average pulse energy Emv obtained from a moving-average spectrum waveform may be used as the moving average values of pulse-laser-beam control parameters.

6. Exemplary Excimer Laser Apparatus that Uses Solid-State Laser Device as Oscillator 6.1 Configuration The laser apparatus 12 of the configuration exemplarily described with reference to FIG. 13 includes a line narrowing gas laser apparatus as the oscillator 22, but the configuration of a laser apparatus is not limited to the example in FIG. 13.

Figure 26:
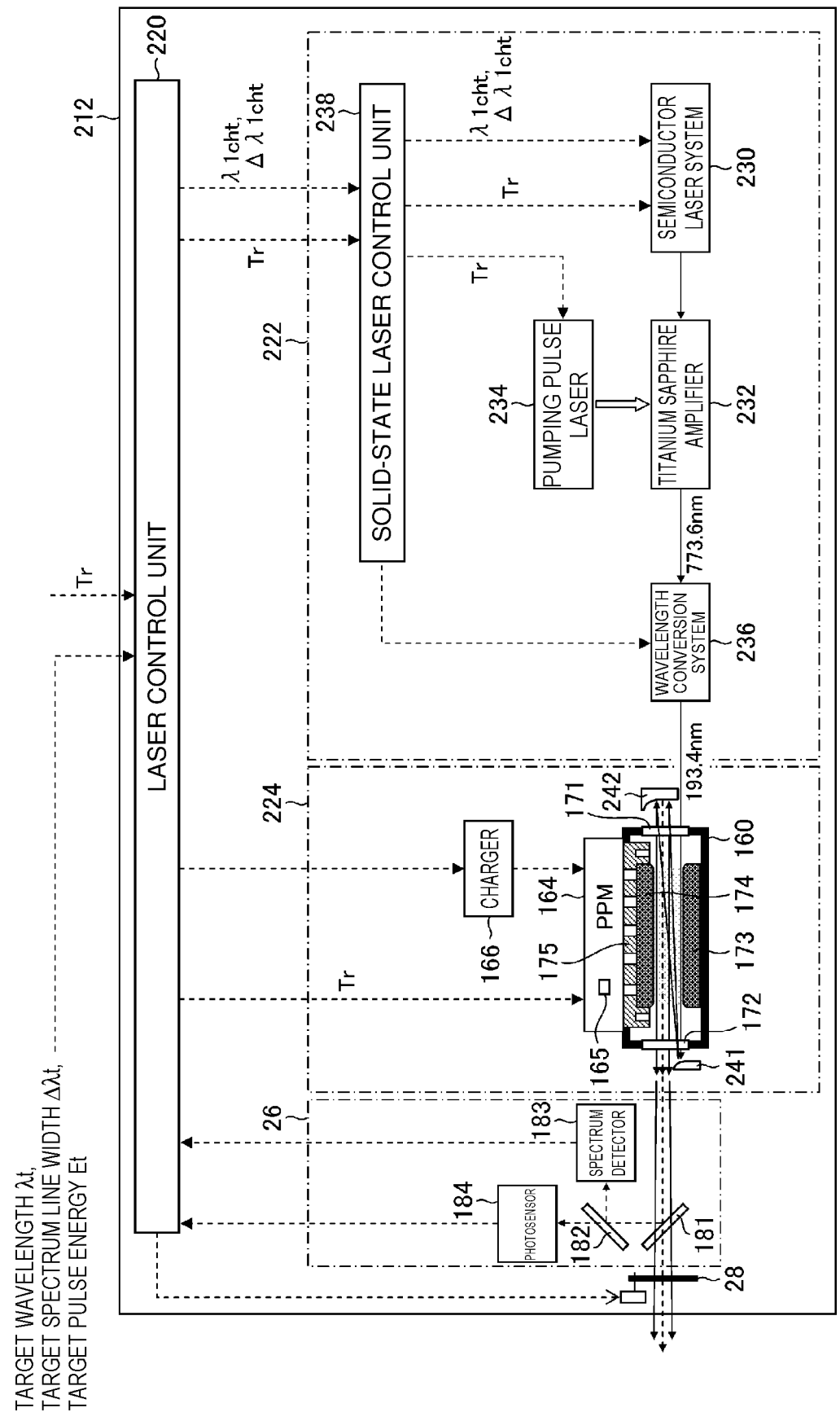
FIG. 26 illustrates another exemplary configuration of a laser apparatus.

FIG. 26 illustrates another exemplary configuration of a laser apparatus. A laser apparatus 212 illustrated in FIG. 26 may be used in place of the laser apparatus 12 illustrated in FIG. 13. In the configuration illustrated in FIG. 26, an element common or similar to that in FIG. 13 is denoted by the same reference sign, and thus description is omitted.

The laser apparatus 212 illustrated in FIG. 26 is an excimer laser apparatus that uses a solid-state laser device as an oscillator, and includes a solid-state laser system 222, an excimer amplifier 224, and a laser control unit 220.

The solid-state laser system 222 includes a semiconductor laser system 230, a titanium sapphire amplifier 232, a pumping pulse laser 234, a wavelength conversion system 236, and a solid-state laser control unit 238.

The semiconductor laser system 230 includes a distributed-feedback (DFB) semiconductor laser configured to emit a CW laser beam having a wavelength of 773.6 nm approximately and a semiconductor optical amplifier (SOA) configured to generate pulses of the CW laser beam. An exemplary configuration of the semiconductor laser system 230 will be described later with reference to FIG. 27.

The titanium sapphire amplifier 232 includes titanium sapphire crystal. The titanium sapphire crystal is disposed on the optical path of a pulse laser beam subjected to pulse amplification at the SOA of the semiconductor laser system 230. The pumping pulse laser 234 may be a laser apparatus configured to emit second-order harmonic light of a YLF laser. Yttrium lithium fluoride (YLF) is solid-state laser crystal expressed by the chemical formula $LiYF_4$.

The wavelength conversion system 236 includes a plurality of non-linear optical crystals, performs wavelength conversion of an incident pulse laser beam, and emits a fourth-order harmonic pulse laser beam. The wavelength conversion system 236 includes, for example, LBO crystal and KBBF crystal. The LBO crystal is non-linear optical crystal expressed by the chemical formula $LiB_3O_5$. The KBBF crystal is non-linear optical crystal expressed by the chemical formula $KBe_2BO_3F_2$. Each crystal is disposed on a non-illustrated rotation stage so that the incident angle on the crystal can be changed.

The solid-state laser control unit 238 controls the semiconductor laser system 230, the pumping pulse laser 234, and the wavelength conversion system 236 in accordance with a command from the laser control unit 220.

The excimer amplifier 224 includes the chamber 160, the PPM 164, the charger 166, a convex mirror 241, and a concave mirror 242. The chamber 160 includes the windows 171 and 172, the pair of electrodes 173 and 174, and the electrically insulating member 175. ArF laser gas is introduced into the chamber 160. The PPM 164 includes the switch 165 and the charging capacitor.

The excimer amplifier 224 has a configuration in which seed light having a wavelength of 193.4 nm is amplified by passing through a discharge space between the pair of electrodes 173 and 174 three times. The seed light having a wavelength of 193.4 nm is a pulse laser beam emitted from the solid-state laser system 222.

The convex mirror 241 and the concave mirror 242 are disposed outside the chamber 160 so that the pulse laser beam emitted from the solid-state laser system 222 is expanded by passing three times.

The seed light having a wavelength of 193.4 nm approximately and having entered the excimer amplifier 224 passes through a discharge space between a pair of discharge electrodes 412 and 413 three times by being reflected at the convex mirror 241 and the concave mirror 242. Accordingly, the beam of the seed light is enlarged and amplified.

6.2 Operation

When having received the target wavelength $\lambda t$, the target spectrum line width $\Delta\lambda t$, and the target pulse energy Et from the exposure control unit 40, the laser control unit 220 calculates, from table data, an approximate expression, or the like, a target wavelength $\lambda 1ct$ and a target spectrum line width $\Delta\lambda 1cht$ of a pulse laser beam from the semiconductor laser system 230 with which the target values are achieved.

The laser control unit 220 transmits the target wavelength $\lambda 1ct$ and the target spectrum line width $\Delta\lambda 1cht$ to the solid-state laser control unit 238 and sets charging voltage to the charger 166 so that a pulse laser beam output from the excimer amplifier 224 has the target pulse energy Et.

The solid-state laser control unit 238 controls the semiconductor laser system 230 so that the wavelength and spectrum line width of a pulse laser beam emitted from the semiconductor laser system 230 become closer to the target wavelength $\lambda 1ct$ and the target spectrum line width $\Delta\lambda 1cht$. The scheme of the control performed by the solid-state laser control unit 238 will be described later with reference to FIGS. 27 to 30.

In addition, the solid-state laser control unit 238 controls two non-illustrated rotation stages to achieve such an incident angle that wavelength conversion efficiency of the LBO crystal and the KBBF crystal of the wavelength conversion system 236 is maximum.

When the light emission trigger signal Tr is transmitted from the exposure control unit 40 to the laser control unit 220, a trigger signal is input to the semiconductor laser system 230, the pumping pulse laser 234, and the switch 165 of the PPM 164 of the excimer amplifier 224 in synchronization with the light emission trigger signal Tr. As a result, pulse current is input to the SOA of the semiconductor laser system 230, and a pulse-amplified pulse laser beam is emitted from the SOA.

The pulse laser beam is emitted from the semiconductor laser system 230 and further pulse-amplified at the titanium sapphire amplifier 232. The pulse laser beam then enters the wavelength conversion system 236. As a result, the pulse laser beam of the target wavelength $\lambda t$ is output from the wavelength conversion system 236.

When having received the light emission trigger signal Tr from the exposure control unit 40, the laser control unit 220 transmits a trigger signal to each of a SOA 260 of the semiconductor laser system 230 to be described later, the switch 165 of the PPM 164, and the pumping pulse laser 234 so that a pulse laser beam emitted from the solid-state laser system 222 discharges when entering the discharge space of the chamber 160 of the excimer amplifier 224.

As a result, the pulse laser beam emitted from the solid-state laser system 222 is amplified at the excimer amplifier 224 through three-time passing. The pulse laser beam amplified by the excimer amplifier 224 is sampled by the beam splitter 181 of the monitor module 26, the pulse energy E is measured by using the photosensor 184, and the wavelength $\lambda$ and the spectrum line width $\Delta\lambda$ are measured by using the spectrum detector 183.

The laser control unit 220 may correct and control the charging voltage of the charger 166 and the wavelength $\lambda 1ct$ and the spectrum line width $\Delta\lambda 1cht$ of the pulse laser beam emitted from the semiconductor laser system 230 based on the pulse energy E, the wavelength $\lambda$, and the spectrum line width $\Delta\lambda$ measured by using the monitor module 26 so that the difference between the pulse energy E and the target pulse energy Et, the difference between the wavelength $\lambda$ and the target wavelength $\lambda t$, and the difference between the spectrum line width $\Delta\lambda$ and the target spectrum line width $\Delta\lambda t$ each become closer to zero.

6.3 Description of Semiconductor Laser System 6.3.1 Configuration

Figure 27:
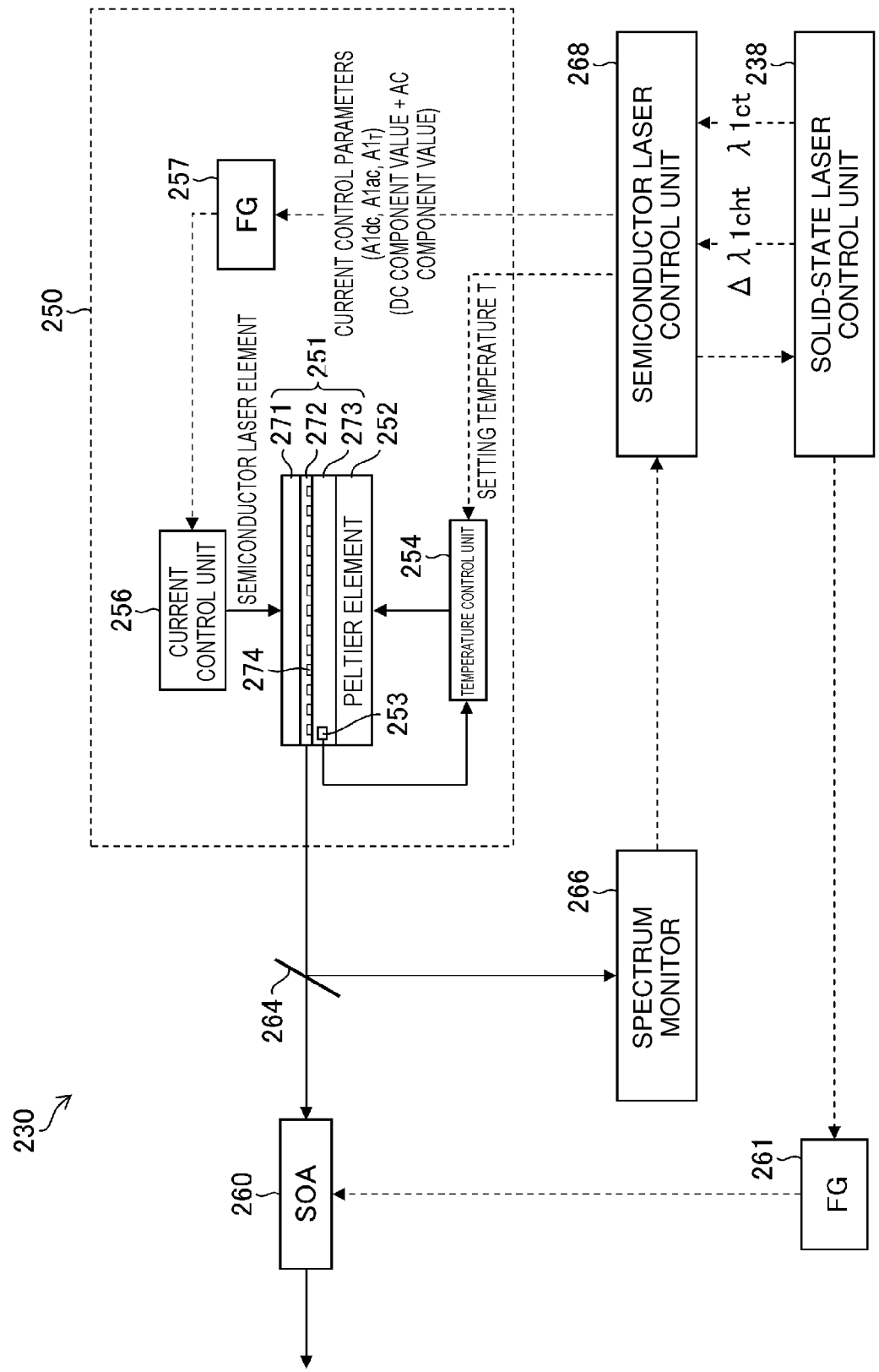
FIG. 27 illustrates an exemplary configuration of a semiconductor laser system.

FIG. 27 illustrates an exemplary configuration of the semiconductor laser system 230. The semiconductor laser system 230 includes a distributed-feedback semiconductor laser 250 of a single longitudinal mode, a semiconductor optical amplifier (SOA) 260, a function generator (FG) 261, a beam splitter 264, a spectrum monitor 266, and a semiconductor laser control unit 268. The distributed-feedback semiconductor laser is referred to as a "DFB laser".

The DFB laser 250 emits a continuous wave (CW) laser beam having a wavelength of 773.6 nm approximately. The DFB laser 250 can change its oscillation wavelength by current control and/or temperature control.

The DFB laser 250 includes a semiconductor laser element 251, a Peltier element 252, a temperature sensor 253, a temperature control unit 254, a current control unit 256, and a function generator 257. The semiconductor laser element 251 includes a first clad layer 271, an active layer 272, and a second clad layer 273 and includes a grating 274 at the boundary between the active layer 272 and the second clad layer 273.

6.3.2 Operation

The DFB laser 250 has an oscillation central wavelength that can be changed by changing a setting temperature T and/or a current value A of the semiconductor laser element 251.

When a spectrum line width is controlled by chirping the oscillation wavelength of the DFB laser 250 at high speed, the control of the spectrum line width can be performed by changing the current value A of current flowing through the semiconductor laser element 251 at high speed.

Specifically, a central wavelength λ1chc and a spectrum line width Δλ1ch of the pulse laser beam emitted from the semiconductor laser system 230 can be controlled at high speed by transmitting values of parameters of a DC component value A1dc, a variation width A1ac of an AC component, and a period A1$_T$ of the AC component as current control parameters from the semiconductor laser control unit 268 to the function generator 257.

The spectrum monitor 266 may measure wavelength by using, for example, a spectrometer or a heterodyne interferometer.

The function generator 257 outputs, to the current control unit 256, an electric signal having a waveform in accordance with a current control parameter designated by the semiconductor laser control unit 268. The current control unit 256 performs current control so that current in accordance with the electric signal from the function generator 257 flows through the semiconductor laser element 251. Note that the function generator 257 may be provided outside the DFB laser 250. For example, the function generator 257 may be included in the semiconductor laser control unit 268.

Figure 28:
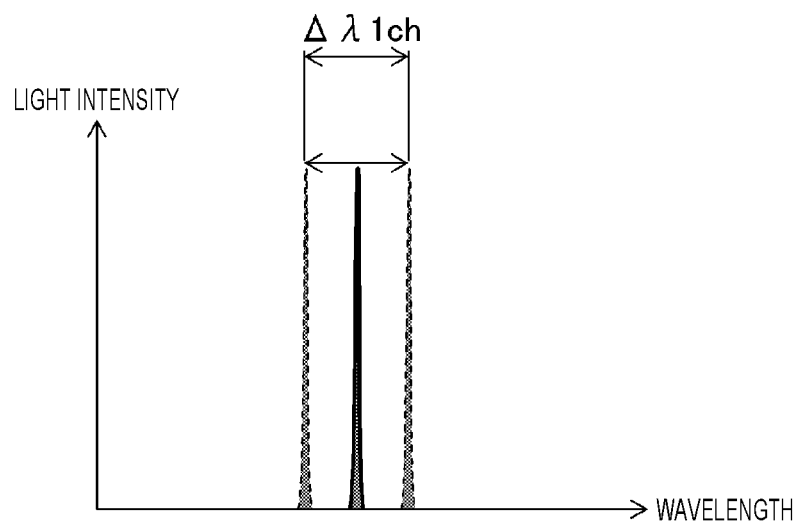
FIG. 28 is a conceptual diagram of a spectrum line width achieved by chirping.

FIG. 28 is a conceptual diagram of a spectrum line width achieved by chirping. The spectrum line width Δλ1ch is measured as the difference between a maximum wavelength and a minimum wavelength generated by chirping.

Figure 29:
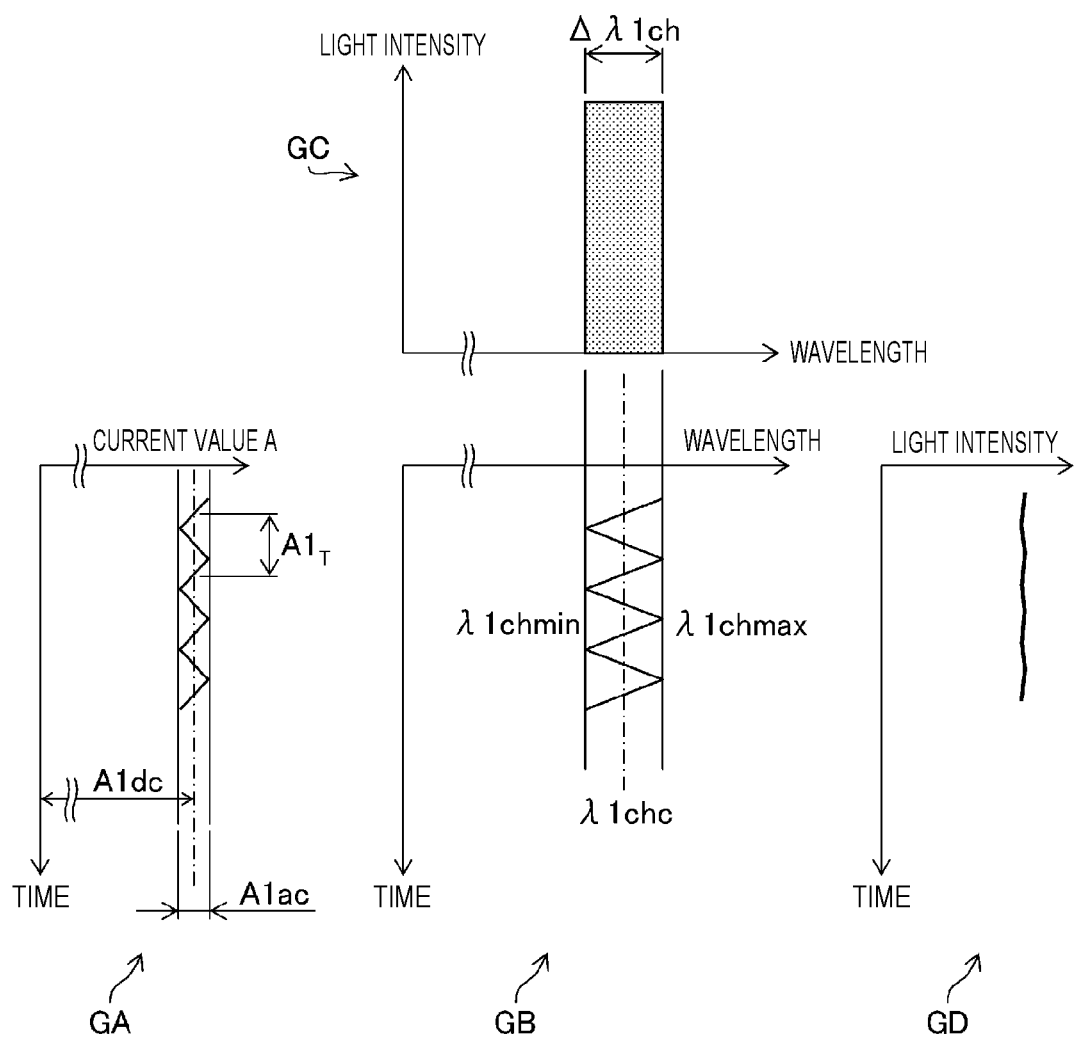
FIG. 29 is a schematic diagram illustrating the relation among current flowing through a semiconductor laser, wavelength change by chirping, a spectrum waveform, and light intensity.

FIG. 29 is a schematic diagram illustrating the relation among current flowing through the semiconductor laser, wavelength change by chirping, a spectrum waveform, and light intensity. A graph GA displayed at a lower-left part of FIG. 29 is a graph illustrating change of the current value A of current flowing through the semiconductor laser element 251. A graph GB displayed at a lower-central part of FIG. 29 is a graph illustrating chirping caused by the current of the graph GA. A graph GC displayed at an upper part of FIG. 29 is a schematic diagram of a spectrum waveform obtained by the chirping of the graph GB. A graph GD displayed at a lower-right part of FIG. 29 is a graph illustrating change of the light intensity of a laser beam emitted from the semiconductor laser system 230 due to the current of the graph GA.

Current control parameters of the semiconductor laser system 230 include the following values as illustrated in the graph GA.

A1dc: DC component value of current flowing through the semiconductor laser element A1ac: variation width of the AC component of current flowing through the semiconductor laser element (the difference between a maximal value and a minimal value of the current)

A1$_T$: period of the AC component of current flowing through the semiconductor laser element In the example illustrated in FIG. 29, triangular wave is illustrated as an exemplary AC component of a current control parameter, and variation of light intensity of the CW laser beam emitted from the DFB laser 250 due to variation of triangular-wave current is small.

The relation between a time width D$_{TW}$ of an amplification pulse of the SOA 260 and the period A1$_T$ of the AC component preferably satisfies Expression (1) below.

$$D_{TW}=n \cdot A1_T \quad (1)$$

where n is an integer equal to or larger than one.

When the relation of Expression (1) is satisfied, change of the spectrum waveform of an amplified pulse laser beam can be suppressed irrespective of the timing of pulse amplification at the SOA 260.

Even when Expression (1) is not satisfied, a pulse width range at the SOA 260 is, for example, 10 ns to 50 ns. The period A1$_T$ of the AC component of current flowing through the semiconductor laser element 251 is sufficiently shorter than the pulse width of the SOA 260 (the time width D$_{TW}$ of an amplification pulse). For example, the period A1$_T$ is preferably 1/1000 to 1/10 of the pulse width of the semiconductor optical amplifier 260. More preferably, the period A1$_T$ may be 1/1000 to 1/100 of the pulse width.

Figure 30:
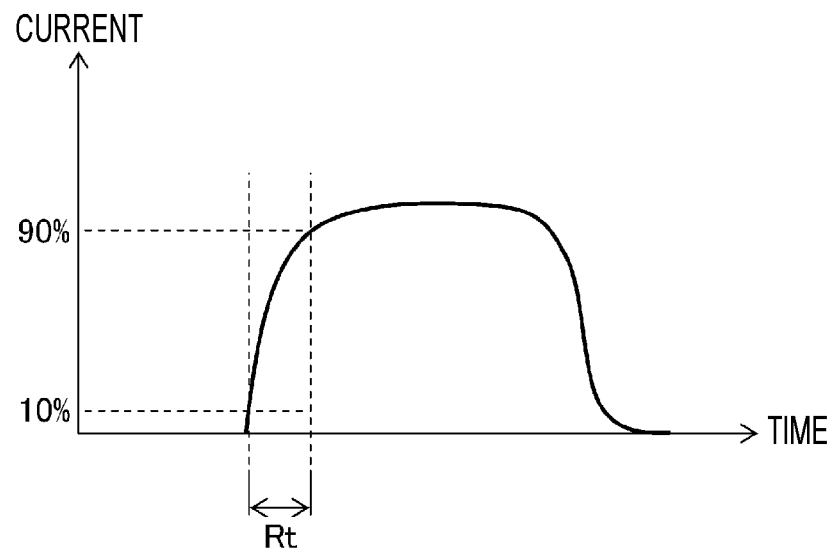
FIG. 30 is a graph for description of a rising time of a semiconductor optical amplifier.

The SOA 260 preferably has a rising time that is, for example, equal to or smaller than 2 ns, more preferably equal to or smaller than 1 ns. The rising time is a time Rt required when the amplitude of the waveform of pulse current increases from 10% to 90% of a maximum amplitude as illustrated in FIG. 30.

6.3.3 Other

In the example illustrated in FIG. 29, triangular wave is illustrated as an exemplary waveform of the AC component of current, but the present invention is not limited to this example and the waveform may be any waveform that changes in a constant period, for example. Examples of the waveform of the AC component other than triangular wave include sine wave and square wave. Various target spectrum waveforms can be generated by controlling the waveform of the AC component.

6.4 Effect

The laser apparatus 212, which uses the solid-state laser system 222 as an oscillator, has the following advantages over a case in which an excimer laser is used as an oscillator.

[1] The solid-state laser system 222 can control the wavelength λ and the spectrum line width Δλ at high speed and high accuracy by controlling the current value A of the DFB laser 250. Specifically, the laser apparatus 212 can control the oscillation wavelength and the spectrum line width Δλ at high speed by controlling the current value A of the DFB laser 250 immediately after receiving data of the target wavelength λt and the target spectrum line width Δλt. Thus, the wavelength λ and the spectrum line width Δλ of a pulse laser beam emitted from the laser apparatus 212 can be changed and controlled at high speed and high accuracy for each pulse.

[2] Moreover, spectrum waveforms of various functions, which are different from a normal spectrum waveform, can be generated through chirping by controlling the current value A of the DFB laser 250.

[3] Thus, a laser apparatus that includes an oscillator using a solid-state laser system including a DFB laser and includes an excimer amplifier is preferable for controlling the wavelength λmv or line width Δλmv of a moving-integration spectrum obtained from a spectrum waveform of the moving integrated value of a spectrum waveform as a laser control parameter.

6.5 Other

An embodiment of a solid-state laser device is not limited to the example illustrated in FIGS. 26 to 30 and may be, for example, a solid-state laser system including a DFB laser having a wavelength of 1547.2 nm approximately and an SOA, and a wavelength conversion system may be a laser apparatus configured to emit eighth-order harmonic light of 193.4 nm. Another solid-state laser device may be a system including a CW oscillation DFB laser and an SOA and configured to pulse-amplify wavelength by controlling the current value of current flowing through the DFB laser and causing pulse current to flow through the SOA.

In the example illustrated in FIG. 26, a multi-pass amplifier is illustrated as an exemplary excimer amplifier, but the present invention is not limited to this embodiment, and the excimer amplifier may be, for example, an amplifier including an optical resonator such as a Fabry-Perot resonator or a ring resonator.

7. Hardware Configurations of Various Control Units

A control device that functions as the laser control unit 20, the exposure control unit 40, the lithography control unit 110, the solid-state laser control unit 238, the semiconductor laser control unit 268, and any other control unit can be achieved by hardware and software combination of one or a plurality of computers. The software is synonymous with a program. The computers conceptually include a programmable controller. Each computer may include a central processing unit (CPU) and a memory. The CPU included in the computer is an example of a processor.

Some or all of processing functions of the control device may be implemented by using an integrated circuit such as a field programmable gate array (FPGA) or an application specific integrated circuit (ASIC).

Functions of a plurality of control devices can be implemented by a single control device. Moreover, in the present disclosure, the control device may be connected with each other through a communication network such as a local area network or the Internet. In a distributed computing environment, a program unit may be stored in local and remote memory storage devices.

8. Electronic Device Manufacturing Method

Figure 31:
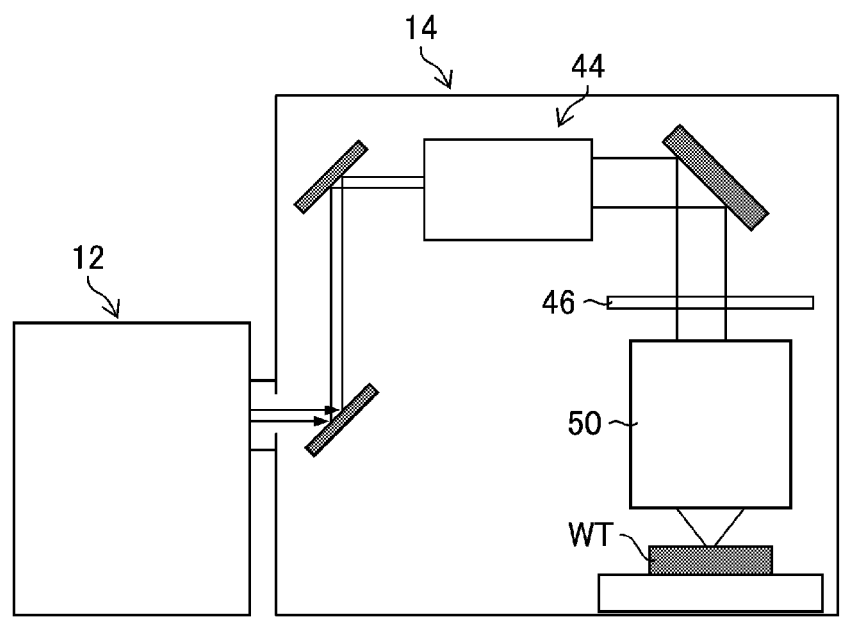
FIG. 31 schematically illustrates an exemplary configuration of an exposure apparatus.

FIG. 31 schematically illustrates an exemplary configuration of the exposure apparatus 14. The exposure apparatus 14 includes the illumination optical system 44 and the projection optical system 50. The illumination optical system 44 illuminates, with a laser beam incident from the laser apparatus 12, the reticle pattern of the reticle 46 disposed on the non-illustrated reticle stage 48. The laser beam having transmitted through the reticle 46 is subjected to reduced projection through the projection optical system 50 and imaged on a non-illustrated workpiece disposed on a workpiece table WT. The workpiece may be a photosensitive substrate such as a semiconductor wafer to which resist is applied. The workpiece table WT may be the wafer stage 54.

The exposure apparatus 14 translates the reticle stage 48 and the workpiece table WT in synchronization so that the workpiece is exposed to the laser beam on which the reticle pattern is reflected. A semiconductor device can be manufactured through a plurality of processes after the reticle pattern is transferred onto the semiconductor wafer through the exposure process as described above. The semiconductor device is an example of an "electronic device" in the present disclosure.

The laser apparatus 12 in FIG. 31 may be, for example, the laser apparatus 212 including the solid-state laser system 222, which is described with reference to FIG. 26.

9. Other

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. An exposure system that performs scanning exposure of a semiconductor substrate by irradiating a reticle with a pulse laser beam, the exposure system comprising:
   a laser apparatus configured to emit the pulse laser beam;
   an illumination optical system through which the pulse laser beam is guided to the reticle;
   a reticle stage configured to move the reticle; and
   a processor configured to control emission of the pulse laser beam from the laser apparatus and movement of the reticle by the reticle stage,
   the reticle having a first region and a second region,
   the processor being configured to instruct the laser apparatus about, based on a proximity effect characteristic corresponding to each of the first region and the second region, a value of a control parameter of the pulse laser beam corresponding to each of the regions so that the laser apparatus emits the pulse laser beam with which a difference of the proximity effect characteristic of each of the regions from a reference proximity effect characteristic is in an allowable range, and
   the control parameter includes at least one of a wavelength and a spectrum line width.

2. The exposure system according to claim 1, wherein the processor is configured to
   calculate the proximity effect characteristic corresponding to each of the first region and the second region, and
   determine the value of the control parameter of the pulse laser beam suitable for each of the regions so that a difference of each of the proximity effect characteristics obtained through the calculation from the reference proximity effect characteristic is in the allowable range.

3. The exposure system according to claim 1, further comprising a projection optical system configured such that an image of the reticle is projected onto the semiconductor substrate through the projection optical system, wherein the processor is configured to
   calculate the proximity effect characteristic corresponding to each of the first region and the second region, by using a plurality of pieces of data including a parameter of the illumination optical system, a parameter of the projection optical system, a parameter of a resist applied on the semiconductor substrate, a reticle pattern of the reticle, and the control parameter of the pulse laser beam,
   determine, based on a result of the calculation, the value of the control parameter of the pulse laser beam with which the difference of the proximity effect characteristic of each of the regions from the reference proximity effect characteristic is in the allowable range, and store the determined value of the control parameter in a first file in association with a corresponding one of the regions.

4. The exposure system according to claim 1, further comprising a server configured to manage a parameter used for the scanning exposure, wherein the server is configured to
 calculate the proximity effect characteristic corresponding to each of the first region and the second region,
 determine, based on a result of the calculation, the value of the control parameter of the pulse laser beam with which a difference of the proximity effect characteristic of each of the regions from the reference proximity effect characteristic is in the allowable range, and
 store the determined value of the control parameter in a first file in association with a corresponding one of the regions.

5. The exposure system according to claim 1, wherein the processor is configured to
 use a first file including data having a determined value of the control parameter of the pulse laser beam with which a difference of the proximity effect characteristic of each of the first region and the second region from the reference proximity effect characteristic is in the allowable range, and
 determine a target value of the control parameter of the pulse laser beam of each pulse in each of the regions.

6. The exposure system according to claim 1, wherein the control parameter further includes pulse energy.

7. The exposure system according to claim 6, wherein the processor is configured to
 set a first target wavelength, a first target spectrum line width, and first target pulse energy of the pulse laser beam based on a first proximity effect characteristic corresponding to the first region and control the laser apparatus to irradiate the first region with a first pulse laser beam, and
 set a second target wavelength, a second target spectrum line width, and second target pulse energy of the pulse laser beam based on a second proximity effect characteristic corresponding to the second region and control the laser apparatus to irradiate the second region with a second pulse laser beam.

8. The exposure system according to claim 1, further comprising an examination device configured to measure a critical dimension of an exposure-completed semiconductor substrate for which the scanning exposure is performed, wherein
 the processor is configured to calculate, based on a result of measurement using the examination device and information of a reticle pattern of the reticle, the value of the control parameter of the pulse laser beam with which a difference of the proximity effect characteristic of each of the first region and the second region from the reference proximity effect characteristic is in the allowable range.

9. The exposure system according to claim 1, wherein the processor is configured to control emission of the pulse laser beam based on a moving integrated value of the control parameter of the pulse laser beam to which a scanning field of the semiconductor substrate is exposed.

10. The exposure system according to claim 9, wherein the control parameter includes a moving integrated value of at least one of a wavelength, a spectrum line width, and pulse energy.

11. The exposure system according to claim 9, wherein the processor is configured to store a measured value of the control parameter of the pulse laser beam of each pulse with which the reticle is irradiated when the scanning exposure is performed and a moving integrated value calculated from the measured value in a storage device in association with time-point data.

12. The exposure system according to claim 9, wherein
 the processor is configured to calculate a target value of the control parameter of a next pulse so that the control parameter of the pulse laser beam becomes equal to a target moving integrated value, and
 control the laser apparatus for each pulse in accordance with the calculated target value.

13. The exposure system according to claim 6, wherein the laser apparatus includes
 a spectrum detector configured to measure a spectrum waveform of the pulse laser beam, and
 a photosensor configured to measure pulse energy of the pulse laser beam, and the processor is configured to
 calculate a moving-integration wavelength from the spectrum waveform of the pulse laser beam measured by using the spectrum detector,
 calculate a moving-integration spectrum line width from the spectrum waveform of the pulse laser beam measured by using the spectrum detector,
 calculate an integrated value of moving-integration pulse energy from the pulse energy of the pulse laser beam measured by using the photosensor, and
 write data of each of the calculated moving-integration wavelength, the calculated moving-integration spectrum line width, the calculated integrated value of moving-integration pulse energy, and the spectrum waveform to a second file.

14. The exposure system according to claim 13, wherein the processor is configured to
 calculate a target moving-integration spectrum waveform from a control parameter of a target pulse laser beam,
 calculate a target spectrum waveform of a next pulse by using the target moving-integration spectrum waveform and the data of the second file and determine a target wavelength and a target spectrum line width of the next pulse based on the target spectrum waveform, and
 determine target pulse energy of the next pulse by using a target integrated value of moving-integration pulse energy and the data of the second file.

15. The exposure system according to claim 1, wherein
 the laser apparatus is an excimer laser apparatus including an oscillator, and
 an amplifier configured to amplify a pulse laser beam emitted from the oscillator, and
 the oscillator includes a line narrowing module.

16. The exposure system according to claim 1, wherein
 the laser apparatus is an excimer laser apparatus including an oscillator, and
 an amplifier configured to amplify a pulse laser beam emitted from the oscillator, and
 the oscillator is a solid-state laser system using a distributed-feedback semiconductor laser.

17. A method of producing a laser control parameter, the method being executed by a processor,
 the laser control parameter being a control parameter of a pulse laser beam with which a reticle of an exposure system configured to perform scanning exposure of a semiconductor substrate is irradiated, the control parameter including at least one of a wavelength and a spectrum line width, the method comprising:

calculating, by the processor, a proximity effect characteristic corresponding to each of a first region and a second region of the reticle, determining, by the processor, based on a result of the calculation, a value of the control parameter of the pulse laser beam with which a difference of the proximity effect characteristic of each of the regions from a reference proximity effect characteristic is in an allowable range, and storing, by the processor, the determined value of the control parameter in a file in association with a corresponding one of the regions.

18. The method of producing the laser control parameter according to claim 17, further comprising:

calculating, by the processor, the proximity effect characteristic corresponding to each of the first region and the second region, by using a plurality of pieces of data including a parameter of an illumination optical system of the exposure system, a parameter of a projection optical system, a parameter of a resist applied on the semiconductor substrate, a reticle pattern of the reticle, and the control parameter of the pulse laser beam, and performing, by the processor, the calculation of the proximity effect characteristic a plurality of times with different values of the control parameter of the pulse laser beam to determine a value of the control parameter of the pulse laser beam with which a difference of each of the proximity effect characteristics from the reference proximity effect characteristic is in the allowable range.

19. The method of producing the laser control parameter according to claim 17, further comprising receiving, by the processor, a measurement result obtained by using an examination device configured to measure a critical dimension of an exposure-completed semiconductor substrate for which the scanning exposure is performed, wherein the processor calculates the proximity effect characteristic corresponding to each of the first region and the second region, based on the measurement result and information of a reticle pattern of the reticle.

20. An electronic device manufacturing method comprising performing scanning exposure of a photosensitive substrate by irradiating a reticle with a pulse laser beam by using an exposure system to manufacture an electronic device, the exposure system including a laser apparatus configured to emit the pulse laser beam, an illumination optical system through which the pulse laser beam is guided to the reticle, a reticle stage configured to move the reticle, and a processor configured to control emission of the pulse laser beam from the laser apparatus and movement of the reticle by the reticle stage, the reticle having a first region and a second region, the processor being configured to instruct the laser apparatus about, based on a proximity effect characteristic corresponding to each of the first region and the second region, a value of a control parameter of the pulse laser beam corresponding to each of the regions so that the laser apparatus emits the pulse laser beam with which a difference of the proximity effect characteristic of each of the regions from a reference proximity effect characteristic is in an allowable range, and the control parameter includes at least one of a wavelength and a spectrum line width.

21. The exposure system according to claim 1, wherein the reference proximity effect characteristic is a reference proximity effect characteristic of a reference exposure apparatus.

22. The method of producing the laser control parameter according to claim 17, wherein the reference proximity effect characteristic is a reference proximity effect characteristic of a reference exposure apparatus.

23. The electronic device manufacturing method according to claim 20, wherein the reference proximity effect characteristic is a reference proximity effect characteristic of a reference exposure apparatus.

\* \* \* \* \*